(12) United States Patent
Laven et al.

(10) Patent No.: US 11,394,194 B2
(45) Date of Patent: Jul. 19, 2022

(54) SEMICONDUCTOR DEVICE WITH SURGE CURRENT PROTECTION

(71) Applicant: Infineon Technologies AG, Neubiberg (DE)

(72) Inventors: Johannes Georg Laven, Taufkirchen (DE); Thomas Basler, Riemerling (DE); Hans-Joachim Schulze, Taufkirchen (DE)

(73) Assignee: Infineon Technologies AG, Neubiberg (DE)

( * ) Notice: Subject to any disclaimer, the term of this patent is extended or adjusted under 35 U.S.C. 154(b) by 305 days.

(21) Appl. No.: 16/791,742

(22) Filed: Feb. 14, 2020

(65) Prior Publication Data

US 2020/0185906 A1 Jun. 11, 2020

Related U.S. Application Data

(63) Continuation of application No. 14/975,757, filed on Dec. 19, 2015, now Pat. No. 10,644,496.

(30) Foreign Application Priority Data

Dec. 23, 2014 (DE) .......................... 102014119544.2

(51) Int. Cl.
*H02H 3/20* (2006.01)
*H01L 23/528* (2006.01)
(Continued)

(52) U.S. Cl.
CPC ........... *H02H 3/202* (2013.01); *H01L 23/528* (2013.01); *H01L 27/0255* (2013.01);
(Continued)

(58) Field of Classification Search
CPC .... H02H 3/202; H02H 7/1225; H01L 23/528; H01L 27/0255; H01L 29/06;
(Continued)

(56) References Cited

U.S. PATENT DOCUMENTS

| 6,069,372 A | 5/2000 | Uenishi |
| 2005/0201027 A1 | 9/2005 | Arashima et al. |

(Continued)

FOREIGN PATENT DOCUMENTS

| CN | 104143973 A | 11/2014 |
| EP | 2779346 A2 | 9/2014 |
| JP | 2007503108 A | 2/2007 |

*Primary Examiner* — Benjamin Tzu-Hung Liu
(74) *Attorney, Agent, or Firm* — Murphy, Bilak & Homilier, PLLC

(57) ABSTRACT

A power inverter includes a bridge circuit including a first half-bridge and a second half-bridge, each half-bridge including a high-side device and a low-side device, and a gate driver circuit connected with each gate of the high-side device and low-side power device of the first and second half-bridges and operable to provide each gate with a respective voltage to control operation of the respective power device. The gate driver is operable to provide a first voltage which is higher than a first threshold voltage of the respective power device, and a second voltage which is higher than a surge threshold of the respective power device. The surge threshold is higher than the first threshold and defines the onset of a surge current operation area of the respective power device at which the power device becomes conducts a surge current that is larger than the rated current of the device.

10 Claims, 9 Drawing Sheets

(51) Int. Cl.
| | |
|---|---|
| H01L 27/02 | (2006.01) |
| H01L 29/06 | (2006.01) |
| H01L 29/10 | (2006.01) |
| H01L 29/417 | (2006.01) |
| H01L 29/423 | (2006.01) |
| H01L 29/78 | (2006.01) |
| H02H 7/122 | (2006.01) |
| H02M 1/00 | (2006.01) |
| H02M 3/135 | (2006.01) |
| H02M 7/44 | (2006.01) |
| H02M 7/48 | (2007.01) |
| H01L 27/082 | (2006.01) |
| H01L 27/088 | (2006.01) |
| H01L 29/739 | (2006.01) |

(52) U.S. Cl.
CPC .......... *H01L 29/06* (2013.01); *H01L 29/0611* (2013.01); *H01L 29/0619* (2013.01); *H01L 29/0696* (2013.01); *H01L 29/1033* (2013.01); *H01L 29/1045* (2013.01); *H01L 29/41708* (2013.01); *H01L 29/4236* (2013.01); *H01L 29/42324* (2013.01); *H01L 29/42336* (2013.01); *H01L 29/7397* (2013.01); *H01L 29/78* (2013.01); *H02H 7/1225* (2013.01); *H02M 1/00* (2013.01); *H02M 3/135* (2013.01); *H02M 7/44* (2013.01); *H02M 7/48* (2013.01); *H01L 27/088* (2013.01); *H01L 27/0825* (2013.01); *H01L 29/1095* (2013.01); *H01L 2924/0002* (2013.01)

(58) Field of Classification Search
CPC ............. H01L 29/0611; H01L 29/0619; H01L 29/0696; H01L 29/1033; H01L 29/1045; H01L 29/41708; H01L 29/42324; H01L 29/42336; H01L 29/4236; H01L 29/7397; H01L 29/78; H01L 27/0825; H01L 27/088; H01L 29/1095; H01L 2924/0002; H02M 1/00; H02M 3/135; H02M 7/44; H02M 7/48

See application file for complete search history.

(56) References Cited

U.S. PATENT DOCUMENTS

| | | |
|---|---|---|
| 2008/0150442 A1 | 6/2008 | Feldtkeller |
| 2008/0200017 A1 | 8/2008 | Doumae |
| 2009/0146177 A1 | 6/2009 | Ng et al. |
| 2009/0236612 A1 | 9/2009 | Nakamura et al. |
| 2011/0188162 A1 | 8/2011 | Wetter et al. |
| 2012/0018777 A1* | 1/2012 | Takizawa ................ H02M 1/32 257/140 |
| 2013/0057227 A1 | 3/2013 | Aurtenetxea et al. |
| 2013/0328062 A1 | 12/2013 | Hisamoto et al. |
| 2014/0226380 A1 | 8/2014 | Kawashima |

* cited by examiner

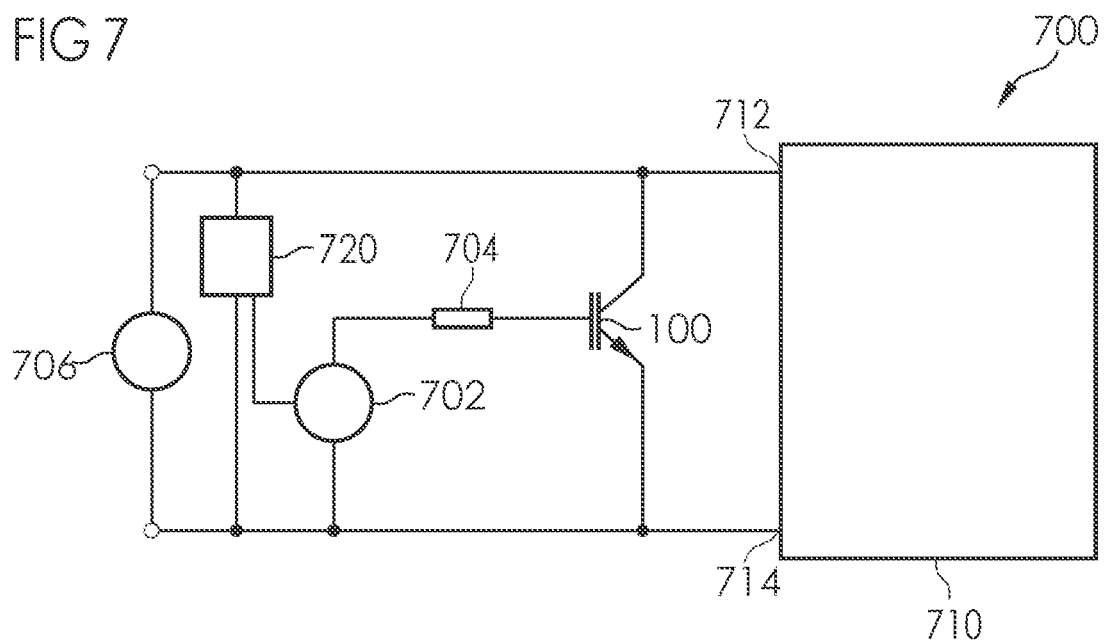

SEMICONDUCTOR DEVICE WITH SURGE CURRENT PROTECTION

PRIORITY CLAIM

This application claims priority to U.S. application Ser. No. 14/975,757 filed on 19 Dec. 2015 which in turn claims priority to German Patent Application No. 10 2014 119 544.2 filed on 23 Dec. 2014, the content of each application incorporated herein by reference in their entirety.

TECHNICAL FIELD

Embodiments described herein relate to power devices, fault protection circuits, power inverter and chopper applications.

BACKGROUND

Power devices that can conduct a rated current are provided in a power system. In case of failure or a short circuit occurring in the power system, the power devices are blocked to avoid damaging of the power devices. For example, for power devices provided for a power inverter, in case of failure or a short circuit (e.g., bridge short circuit) of the power inverter, the switches are pulse-blocked to avoid damaging of the power devices and of the complete inverter system. However, this leads to an asymmetric short of a load connected to the power inverter. In case of a generator of a wind turbine that is connected to the power inverter, mechanical stress (specifically in form of alternating torques) occurs in the wind turbine that may lead to the destruction of the wind turbine.

In view of the above, there is a need for improvement. A power device capable to symmetrize the load short circuit is desired. Therefore, it is envisaged to develop a power device able to conduct currents up to 20 times the rated current without desaturation.

SUMMARY

According to an embodiment, a power device includes a semiconductor substrate having a plurality of switchable cells defining an active area of the power device, each of the switchable cells having an emitter region, and a collector region, an emitter metallization in ohmic contact with the emitter region of the switchable cells, and a collector metallization in ohmic contact with the collector region of the switchable cells. The active area includes first switchable regions and second switchable regions different to the first switchable region, wherein each of the first and second switchable regions includes at least a portion of one or more of the switchable cells. The first switchable regions have a first threshold in the range of 5 V to 10 V defining a device threshold at which the power device becomes conductive for continuously conducting a rated current of the power device between the emitter metallization and the collector metallization. Wherein the second switchable regions have a second threshold in the range of 15 V to 25 V defining a surge threshold of the power device at which the power device becomes operable to conduct a surge current between the emitter metallization and the collector metallization, wherein the surge current of the power device is at least five times as large as the rated current of the power device. The power device can be, according to an embodiment, an IGBT.

According to an embodiment, a fault protecting circuit for a power system, includes an power device, wherein the power device has a collector terminal in ohmic contact with the collector region of the power device and an emitter terminal in ohmic contact the emitter region of the power device, wherein the collector terminal and the emitter terminals are connectable with respective input terminals of a power system to be protected by the fault protecting circuit. The fault protecting circuit further includes a detection circuit operable to detect an overvoltage or overcurrent for the power systems, wherein the detection circuit is operable to apply a voltage equal to or higher than the second threshold of the power device to conduct a surge current between the input terminals of the power system and therefore to short the input terminals of the power system The power device can be, according to an embodiment, an IGBT.

According to an embodiment, a power inverter includes a bridge circuit includes a first half-bridge including a high-side power device connected between a first node and a high-side node of an intermediate circuit storage, and a low-side power device connected between the first node and a low-side node of the intermediate circuit storage. The bridge circuit further includes at least a second half-bridge having a high-side power device connected between a second node and the high-side node of the intermediate circuit storage, and a low-side power device connected between the second node and the low-side node of the intermediate circuit storage. The power inverter further includes a gate driver circuit connected with each gate of the high-side device and low-side power device of the first and second half-bridges and operable to provide each gate with a respective voltage to control operation of the respective power device, wherein the gate driver circuit is operable to provide a first voltage which is higher than a first threshold voltage of the respective power device at which the respective power device becomes conductive for continuously conducting a rated current of the respective power device, and a second voltage which is higher than a surge threshold of the respective power device, wherein the surge threshold is at least two times as high as the first threshold and defines the onset of a surge current operation area of the respective power device at which the respective power device becomes operable to conduct a surge current which is at least five times as large as the rated current of the respective power device According to an embodiment, a crow bar includes a first diode bridge, a first node, and a power device.

According to an embodiment, a chopper application includes a first input terminal for connecting with a power supply, a first output terminal for connecting with a load, and a power device, wherein the power device electrically is connected in parallel with the first input terminal and the first output terminal.

According to an embodiment, a method is provided for operating a power inverter having a bridge circuit which includes a first half-bridge having a high-side power device connected between a first node and a high-side node of an intermediate circuit storage, and a low-side power device connected between the first node and a low-side node of the intermediate circuit storage, and at least a second half-bridge having a high-side power device connected between a second node and the high-side node of the intermediate circuit storage, and a low-side power device connected between the second node and the low-side node of the intermediate circuit storage. The method includes: detecting a collector-emitter voltage Vce and/or a collector current Ic; determined whether an overcurrent or overvoltage conditions has been met; and applying a gate voltage Vg above a surge threshold defining the onset of a surge current operation area of the respective power device.

Those skilled in the art will recognise additional features and advantages upon reading the following detailed description, and upon viewing the accompanying drawings.

BRIEF DESCRIPTION OF THE DRAWINGS

The components in the figures are not necessarily to scale, instead emphasis being placed upon illustrating the principles of the invention. Moreover, in the figures, like reference signs designate corresponding parts. In the drawings:

FIG. 7 illustrates a fault protection circuit, according to an embodiment.

DETAILED DESCRIPTION

Figure 1:
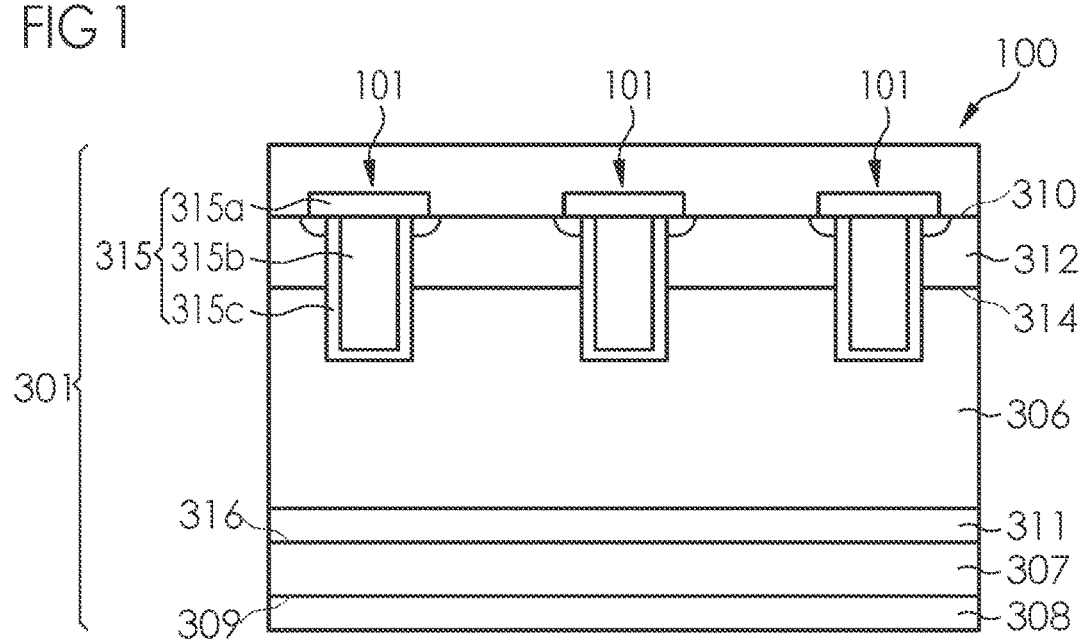
FIG. 1 illustrates a power device, according to an embodiment.

In the following Detailed Description, reference is made to the accompanying drawings, which form a part hereof, and in which are shown by way of illustration specific embodiments in which the invention may be practiced. In this regard, directional terminology, such as "top", "bottom", "front", "back", leading", "trailing", "lateral", "vertical" etc., is used with reference to the orientation of the Figure(s) being described. These terms are intended to encompass different orientations of the device in addition to different orientations than those depicted in the figures. Because components of embodiments can be positioned in a number of different orientations, the directional terminology is used for purpose of illustration and is in no way limiting. Further, terms such as "first", "second", and the like, are also used to describe various elements, regions, sections, etc. and are also not intended to be limiting. Like terms refer to like elements throughout the description. It is to be understood that other embodiments may be utilised and structural or logical changes may be made without departing from the scope of the present invention. The following detailed description, therefore, is not to be taken in a limiting sense, and the scope of the present invention is defined by the appended claims. The embodiments being described use specific language, which should not be construed as limiting the scope of the appended claims.

The threshold voltage, commonly abbreviated as Vth, of a field-effect transistor (FET) is the value of the gate-source voltage at which the conductive properties of the FET significantly changes, either from non-conductive to conductive in case of enhancement devices of from conductive to non-conductive with increasing gate-source voltage in case of depletion devices. The threshold voltage is also referred to as pinch-off voltage. For enhancement devices, an inversion channel is formed in the channel region of the body region next to the dielectric region or dielectric layer when the voltage between the gate electrode and the source region is above the threshold voltage Vth. At the threshold voltage, the channel region formed in the body region begins to establish an ohmic connection between the source and drain contacts of the transistor. Below this threshold voltage, the FET is non-conductive. Thus, the threshold voltage Vth often refers to the minimum gate voltage necessary for the onset of a unipolar current flow between the two semiconductor regions of the first conductivity type, which form the source and the drain or drain of a transistor structure.

In this specification, a second surface of a semiconductor substrate is considered to be formed by the lower or backside surface while a first surface is considered to be formed by the upper, front or main surface of the semiconductor substrate. The terms "above" and "below" as used in this specification therefore describe a relative location of a structural feature to another structural feature with consideration of this orientation.

In the context of the present specification, the term "MOS" (metal-oxide-semiconductor) should be understood as including the more general term "MIS" (metal-insulator-semiconductor). For example, the term MOSFET (metal-oxide-semiconductor field-effect transistor) should be understood to also include FETs having a gate insulator that is not an oxide, i.e. the term MOSFET is used in the more general term meaning of IGFET (insulated-gate field-effect transistor) and MISFET (metal-insulator-semiconductor field-effect transistor), respectively. The term "metal" for the gate material of the MOSFET should be understood to include electrically conductive materials such as, but not restricted to, metal, alloys, doped polycrystalline semiconductors and metal semiconductor compounds such as metal silicides.

Field-effect controlled switching devices such as Metal Oxide Semiconductor Field-effect Transistors (MOSFETs) or Insulated Gate Bipolar Transistors (IGBTs) have been used for various applications, including use as switches in power supplies and power converters, electric cars, air-conditioners, and even stereo systems. Particularly with regard to power devices capable of switching large currents and/or operating at higher voltages, a low resistance in the conducting on-state is often desired. This means e.g. that, for a given current to be switched, the voltage drop across the switched on FET, e.g., the source-drain voltage is desired to be low. On the other hand, the losses occurring during switching off or commutating of the FET are often also to be kept small to minimize the overall losses.

The term "semiconductor power switch" as used in this specification intends to describe a semiconductor device on a single chip with high voltage and/or high current switching capabilities. In other words, power semiconductor devices are intended for high current, typically in the Ampere range. Within this specification the terms "semiconductor power switch", "semiconductor switching device", and "power semiconductor device" are used synonymously.

In the context of the present specification, the term "active cell region" or "active area" intends to describe a region of a semiconductor substrate of the semiconductor switching device where switchable cells which carry the load current are arranged. The switchable cells in the active area define the switching behavior of the semiconductor switching device. Specifically, an active area can include at least a main or first switchable region and a second switchable region, optionally more than two different switchable regions. Switchable cells in different switchable regions can differ from each other in at least one physical property such as the gate-drain capacitance or the threshold voltage. The different switchable regions of the active area are also referred to as "sub-regions" of the active area and describe regions having switchable cells, or portions of switchable cells, with physical properties which are different to the physical properties of switchable cells of other sub-regions. In particular, different sub-regions can be manufactured with different threshold voltages such that the threshold voltage of an individual cell or a group of individual cells of a specific sub-region is different to the threshold voltage of an individual cell or a group of individual cells of another specific sub-region.

In the context of the present specification, the term "cell pitch" or "longitudinal pitch" intends to describe the pitch of the switchable cells in the active area.

In the context of the present specification, the term "gate electrode structure" intends to describe a conductive structure which is arranged next to, and insulated from the semiconductor substrate by a dielectric region or dielectric layer. The gate electrode structure covers, when seen onto the surface of the semiconductor substrate, different regions of the semiconductor device such as body regions and drift regions. The gate electrode structure includes the gate electrodes of the switchable cells next to the body regions and also electrical connections between adjacent gate electrodes which are electrically connected with each other. The gate electrodes are configured to form and/or control the conductivity of a channel region in the body region, for example by the electric-field-mediated formation of an "inversion channel" in the body regions between the respective source regions and drift regions of the switchable cells. When forming an inversion channel, the conductivity type of the channel region is typically changed, i.e., inverted, to form an unipolar current path between the source and the drain region. The gate electrode structure is often conveniently referred to as gate polysilicon.

Examples of dielectric materials for forming a dielectric region or dielectric layer between the gate electrode and the body region include, without being limited thereto, silicon oxide ($SiO_2$), silicon nitride ($Si_3N_4$), silicon oxinitride ($SiO_xN_y$), zirconium oxide ($ZrO_2$), tantalum oxide ($Ta_2O_5$), titanium oxide ($TiO_2$) and hafnium oxide ($HfO_2$), and combinations thereof including stacks of different insulating materials.

The terms "electrical connection" and "electrically connected" describes an ohmic connection between two elements.

In the context of the present specification, the term "gate signal emitter" intends to describe an electrode configuration which provides transfer of external switching signals to the gate electrode structure of the switchable cells. Within this specification the terms "gate metallization" and "gate signal emitter" are used synonymously. Typically, the gate metallization is formed on the gate electrode structure to improve distribution of the switching signal. For example, the gate electrode structure is formed by polysilicon and can have a net-like structure covering the active area while the gate metallization is formed on and in ohmic contact with the gate electrode structure in the periphery of the semiconductor device, for example, in the edge termination area. The gate metallization can include, for example, a gate ring, or a gate ring and gate fingers extending from the gate ring into the active area. The net-like structure of the gate electrode structure includes openings for source plugs or source contacts. Gate signal emitters typically have a lower specific resistance than the gate electrode structure. For example, gate signal emitters can be made of a more conductive material than the gate electrode structure and/or can be made thicker than the gate electrode structure to reduce the resistance.

In this specification, n-doped is referred to as first conductivity type while p-doped is referred to as second conductivity type. Alternatively, the semiconductor devices can be formed with opposite doping relations so that the first conductivity type can be p-doped and the second conductivity type can be n-doped. Furthermore, some Figures illustrate relative doping concentrations by indicating "−" or "+" next to the doping type. For example, "$n^-$" means a doping concentration which is less than the doping concentration of an "n"-doping region while an "$n^+$"-doping region has a larger doping concentration than the "n"-doping region. However, indicating the relative doping concentration does not mean that doping regions of the same relative doping concentration have to have the same absolute doping concentration unless otherwise stated. For example, two different $n^+$-doping regions can have different absolute doping concentrations. The same applies, for example, to an $n^+$-doping and a $p^+$-doping region.

An embodiment is described next with reference to FIG. 1. With reference to FIG. 1, a power device 100 having a plurality of switchable cells 101 provided in a semiconductor substrate 301 is described. The plurality of switchable cells 101 defines an active area of the power device 100.

The semiconductor substrate 301 has a first, upper side 310 and a second, lower side 309. At the first side 310, an emitter region is formed which is in electrical contact with an emitter metallization. At the second side 309, a collector region 307 is formed which is in electrical contact to a collector metallization 308. A gate electrode structure 315 can be formed at the first side 310. The gate electrode structure 315 preferably includes a gate electrode 315a and a gate trench structure 315b extending into the semiconductor substrate 301. A gate insulating layer 315c can be provided between the gate trench structure 315b and the semiconductor substrate 301 for electrical insulation. A body region 312 can be provided at the first side 310 and can extend into the semiconductor substrate 301. A first pn-junction 314 can be formed between the body region 312 and a drift region 306. A second pn-junction 316 can be formed between the drift region 306 and the collector region 307. In typical embodiments, a buffer layer 311 having the same semiconductor charge carrier type as the drift region 306 can be interposed between the drift region 306 and the collector region 307.

When a gate Voltage Vg higher than a threshold voltage Vth is applied to the gate electrode structure 315, a collector current Ic or collector emitter current Ice flows between the emitter metallization and the collector metallization 308. Generally, the relationship between output and input of an electronic system is referred to as transfer characteristic. In the case of the power device, the dependency of the collector current Ic on the gate voltage Vg is usually referred to as the transfer characteristic of the power device. In typical embodiments, a collector current Ic is applied to the power device, resulting in a respective collector emitter voltage Vce for given gate voltage Vg.

According to an embodiment, which can be combined with other embodiments, the active area of the power device 100 includes at least a first switchable region and at least a second switchable region different to the first switchable region. Each of the first and second switchable regions includes at least a portion of one or more of the switchable cells. According to an embodiment, which can be combined with other embodiments, the first and the second switchable regions have different transfer characteristics. The first switchable region and the second switchable region preferably differ by their respective threshold voltage.

According to an embodiment, which can be combined with other embodiments, the first switchable region has a first threshold Vth1 defining a device threshold at which the power device able to conduct a current (e.g. rated current or nominal current) between the emitter metallization and the collector metallization. Preferably, the first threshold Vth1 is in the range of 5 to 10 V, specifically in the range of 6 to 8 V. In typical embodiments, from the first threshold Vth1 a first saturation current level can be defined where the power device may limit the current by channel pinch-off (typ. 3-6 times the nominal current).

According to an embodiment, which can be combined with other embodiments, the second switchable region has a second threshold Vth2 defining a surge threshold of the power device at which the power device becomes operable to conduct a surge current between the emitter metallization and the collector metallization, wherein the surge current of the power device is at least five times as large as the rated current of the power device. Preferably, the second threshold Vth2 is in the range of 15 to 25 V, specifically in the range of 18 to 22 V. In typical embodiments, from the second threshold Vth2 a second saturation current level can be defined where the IGBT may limit the current by channel pinch-off (e.g. 20 times the nominal current or higher, specifically at least 25 times the nominal current).

The power device 100 can be made of any semiconductor material suitable for manufacturing semiconductor components. Examples of such materials include, without being limited thereto, elementary semiconductor materials such as silicon (Si), group IV compound semiconductor materials such as silicon carbide (SiC) or silicon germanium (SiGe), binary, ternary or quaternary III-V semiconductor materials such as gallium arsenide (GaAs), gallium phosphide (GaP), indium phosphide (InP), gallium nitride (GaN), aluminium gallium nitride (AlGaN), indium gallium phosphide (InGaPa) or indium gallium arsenide phosphide (InGaAsP), and binary or ternary II-VI semiconductor materials such as cadmium telluride (CdTe) and mercury cadmium telluride (HgCdTe) to name few. The above mentioned semiconductor materials are also referred to as homojunction semiconductor materials. When combining two different semiconductor materials a heterojunction semiconductor material is formed. Examples of heterojunction semiconductor materials include, without being limited thereto, silicon ($Si_xC_{1-x}$) and SiGe heterojunction semiconductor material. For power semiconductor applications currently mainly Si, SiC and GaN materials are used.

Figure 2:
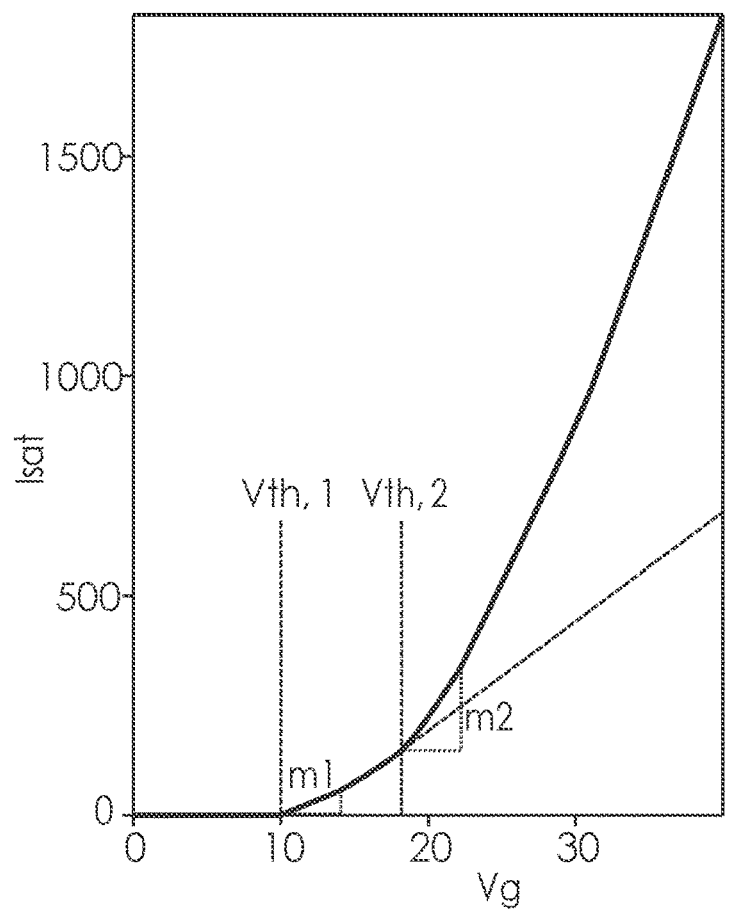
FIG. 2 illustrates a transfer characteristic of a power device, according to an embodiment.

FIG. 2 shows transfer characteristics of the power device 100. The transfer characteristic of FIG. 2 shows a saturation current Isat of the collector current Ic of the power device at different gate voltages Vg.

As can be seen from FIG. 2, the saturation current Isat stays constant at a leakage current level until the gate voltage Vg reaches the first threshold Vth1. From the first threshold Vth1 on, the saturation current Isat increases with increasing gate voltage Vg. For example, the saturation current Isat increases with a first slope m1 or first gradient m1. When the gate voltage Vg reaches the second threshold Vth2, the saturation current Isat increases with a second slope m2 or second gradient m2. Preferably, the second slope m2 is greater than the first slope m1, i.e. m2>m1. Specifically, the transfer characteristics of the power device 100 for gate voltages Vg between the first threshold Vth1 and the second threshold Vth2 is determined by the first switchable region, specifically by the transfer characteristic of the switchable cells 101a of the first switchable region. The transfer characteristics of the power device 100 for gate voltages Vg above the second threshold Vth2 may be determined by the first switchable region and the second switchable region, specifically by the transfer characteristic of the switchable cells 101a of the first switchable region and the second switchable region. Preferably, the second slope m2 is several times higher as the first slope m1, e.g. at least five times as high as the first slope m1, whereby the transfer characteristics above the second threshold Vth2 may be dominated by the second switchable region, specifically by the transfer characteristic of the switchable cells 101b of the second switchable region.

According to an embodiment, which can be combined with other embodiments, a slope or transconductance of the transfer characteristics of the switchable cells arranged in the second switchable region is higher than a slope of the transfer characteristics of the switchable cells arranged in the first switchable region. Specifically, the transconductance may be proportional to the collector current Ic.

In FIG. 2, the dashed line represents the transfer characteristics of the power device in the case that the gate voltage Vg is not raised to or above the second threshold Vth2. In this case, the transfer characteristic of the power device 100 relies on the first slope m1. Accordingly, the transfer characteristic of the power device is provided by the transfer characteristic of the first switchable region. That is, in this case, the switchable cells 101b of the second switchable region are not turned operable.

Preferably, the rated current of the power device is the current flowing between the emitter metallization and the collector metallization in the first switchable region in case that the gate Voltage Vg is between the first threshold Vth1 and the second threshold Vth2. Further, the surge current of the power device is the current flowing between the emitter metallization and the collector metallization in the first switchable region and the second switchable region in case that the gate Voltage Vg is higher than the second threshold Vth2. According to an embodiment, which can be combined with other embodiments, the surge current or the surge current capability of the power device is determined by the current flowing between the emitter metallization and the collector metallization in the second switchable region. In this case, the current flowing between the emitter metallization and the collector metallization in the second switchable region may be several times higher, specifically at least five times higher, as the current flowing between the emitter metallization and the collector metallization in the first switchable region. However, the device is not intended to conduct/reach Isat at normal operation due to high losses. In power device short-circuit mode, the power device may conduct Isat in combination with high Vce voltages for some microseconds.

In the context of the present disclosure, surge current capability may be the ability of the power device to conduct a current that is considerable higher than the nominal current, e.g., twenty times as high as the nominal current, without reaching the saturation current Isat shown in the transfer characteristics of FIG. 2. Specifically, if the surge current would approximate this value, high losses would occur due to a high collector emitter voltage. Thus, a steep second slope m2 is envisaged.

According to an embodiment, which can be combined with other embodiments, the second switchable region has a second threshold which is at least two times as high as the first threshold and which defines a surge threshold of the power device at which the power device becomes operable to conduct a surge current between the emitter metallization and the collector metallization without Vce-desaturation, i.e., without reaching Isat, wherein the surge current of the power device is at least five times as large as the rated current of the power device, and wherein the first switchable region includes a first surface area of the semiconductor substrate, the second switchable region includes a second surface area of the semiconductor substrate, the second surface area being larger than the first surface area According to an embodiment, which can be combined with other embodiments, the second switchable region has a second threshold which is at least two times as high as the first threshold and which defines a surge threshold of the power device at which the power device becomes operable to conduct a surge current. Specifically, conduction losses may be smaller in the second switchable region than in the first switchable region in case of an overcurrent event. Further, the second switchable region may desaturate (or show channel pinch-off) later than the first switchable region in case of an overcurrent event.

According to an embodiment, which can be combined with other embodiments, the second switchable region has a second threshold which is at least two times as high as the first threshold and which defines a surge threshold of the power device at which the power device becomes operable to conduct a surge current between the emitter metallization and the collector metallization, and wherein a slope of the transfer characteristics (transconductance) of the switchable cells arranged in the second switchable region is higher than a slope of the transfer characteristics of the switchable cells arranged in the first switchable region.

In the context of the present specification, a slope may be calculated by finding the ratio of the "vertical change" to the "horizontal change" between (any) two distinct points on a line. Sometimes the ratio is expressed as a quotient ("rise over run"), giving the same number for every two distinct points on the same line. As a generalization of this practical description, the mathematics of differential calculus defines the slope of a curve at a point as the slope of the tangent line at that point. When the curve given by a series of points in a diagram or in a list of the coordinates of points, the slope may be calculated not at a point but between any two given points. When the curve is given as a continuous function, perhaps as an algebraic formula, then the differential calculus provides rules giving a formula for the slope of the curve at any point in the middle of the curve.

During normal operation of the power device 100, the gate voltage Vg is in the range between the first threshold Vth1 and the second threshold Vth2. In this case, the gate voltage Vg may be 15 V. Accordingly, the rated current is conducted between the emitter metallization and the collector metallization. That is, only the first switchable region is operated. Further, the second threshold Vth2 may be provided such that even for an excess voltage of, e.g., 18 V of the gate voltage Vg the second threshold Vth2 is not met. The excess voltage may occur in case of a short circuit due to inductive or capacitive charging (by, e.g., Miller capacities due to a fast voltage change). Thereby, it can be ensured that the second switchable region is not made conductive in case of an intermediate short circuit of the power device.

Further, short-circuit strength of the power device 100 can be ensured for intermediate circuit shorts (e.g. low inductive DC-link short circuit events).

During surge current operation of the power device 100, the gate voltage Vg is at or above the second threshold Vth2. In this case, the gate voltage Vg may be 20 to 25 V. Accordingly, the surge current is conducted between the emitter metallization and the collector metallization. That is, the surge current is the sum of the current conducted by the first switchable region and the second switchable region. As the current conducting ability (or, in other words, the saturation current Isat) is much higher in the second switchable region as in the first switchable region, most of the surge current is conducted by the second switchable region. In this context, current conducting ability may mean to conduct a high current without reaching the Isat level of the power device and to keep the losses (resp. Vce,sat) low. For example, a surge current of about 700 A can be conducted by the power device at a gate voltage Vg of about 25 V, whereas the rated current may be 50 A at the same gate voltage.

Specifically, a second threshold Vth2 of 20 V to 25 V enables the use of conventional gate voltage drivers, which are usually designed for providing a voltage up to 20 V or 25 V. Further, by using a second threshold Vth2 of 20 V or 25 V, i.e., a second threshold Vth2 that is just a few Volts higher than the gate voltage for normal operation, the gate insulation layer 315c of the switchable cells 101a in the first switchable region may not be damaged due to burden of the switchable cells 101a of the first switchable region with an excess gate voltage, whereby the life span of the power device can be improved.

FIGS. 3A to 3G illustrate a function of the power device.

Figure 3C:
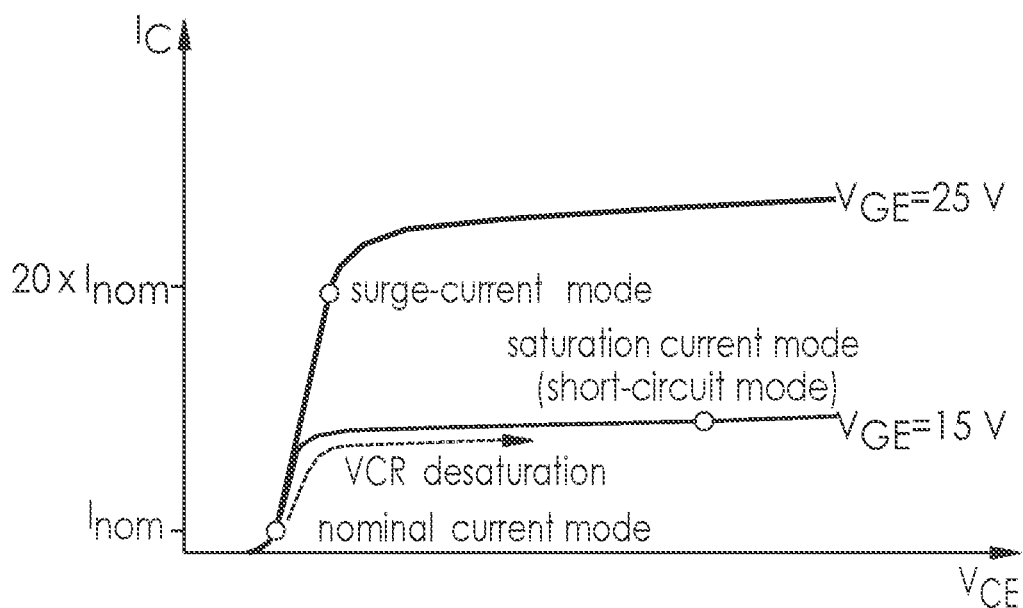
FIGS. 3A to 3H illustrates the function of the power device, according to an embodiment.
Figure 3A:
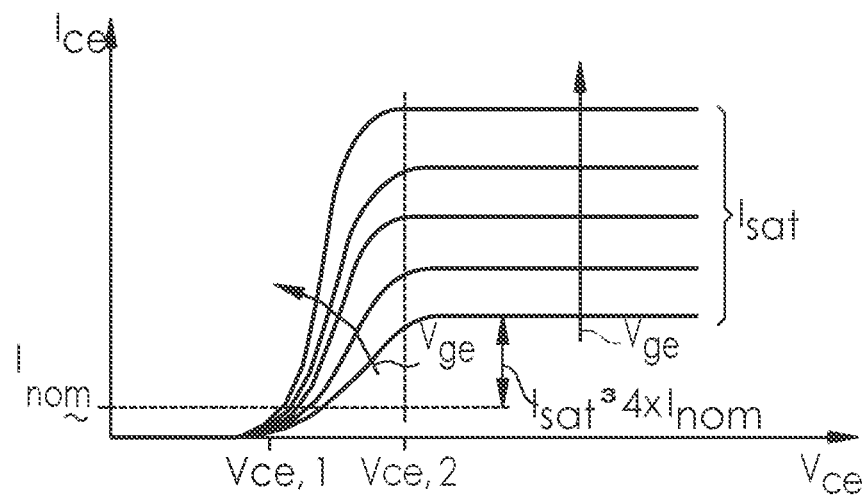

FIG. 3A illustrates a output characteristic of the power device, specifically the saturation current Isat of the collector current Ic of the switchable cells 101a arranged in the first switchable region and/or the switchable cells 101b arranged in the second switchable region of the power device 100 as a function of the collector emitter Voltage Vce and the gate voltage Vg. Specifically, for an applied collector current Ic a respective collector emitter voltage Vce will develop in the power device. As can be seen from FIG. 3A, the collector current Ic increases substantially from a first collector emitter Voltage Vce1 to a second collector emitter Voltage Vce2. For a collector emitter Voltage Vce larger than the second collector emitter Voltage Vce2, the collector current saturates to a saturation current Isat. Specifically, the saturation current Isat may have a constant value for a collector emitter Voltage Vce larger than the second collector emitter Voltage Vce2 but may increase again for collector emitter Voltages Vce clearly exceeding the second collector emitter Voltage Vce2. As can be further seen from FIG. 3A, the rated current may be the current that may be conductable at a collector emitter Voltage Vce slightly above the first collector emitter Voltage Vce1, i.e. the rated current may be the current that may be conductable at a collector emitter Voltage Vce that is closer to the first collector emitter Voltage Vce1 than to the second collector emitter Voltage Vce2. This current may be referred to as the nominal current. As shown in FIG. 3A, the saturation current Isat may be four times as large as the nominal current.

Further, the value of the collector current Ic resulting in a collector emitter Voltage Vce between the first collector emitter Voltage Vce1 and the second collector emitter Voltage Vce2 and the value of the saturation current Isat depends on the gate voltage Vg applied to the gate or gate electrode structure 315 of the power device 100. Preferably, the value of the collector current Ic resulting in a collector emitter Voltage Vce between the first collector emitter Voltage Vce1 and the second collector emitter Voltage Vce2 and the value of the saturation current Isat increases with an increasing gate Voltage Vg. However, conventional power devices are designed for a specific range of gate voltages that can be applied. For a gate voltage exceeding the design limit, the gate insulating layer may be damaged. Thus, increasing the gate voltage is not a feasible approach for increasing the current that can be conducted by the power device.

Accordingly, the power device 100 includes the switchable cells 101b arranged in the second switchable region in addition to the switchable cells 101a arranged in the first switchable region. As can be seen from FIG. 3B, the switchable cells 101a arranged in the first switchable region become conductive for continuously conducting a rated current if an gate voltage Vg larger than the first threshold Vth1 is applied, whereas the switchable cells 101b arranged in the second switchable region become conductive for conducting a surge current if an gate voltage Vg larger than the second threshold Vth2 is applied. Specifically, a transconductance of the switchable cells 101b arranged in the second switchable region is larger than a transconductance of the switchable cells 101a arranged in the first switchable region.

That is, the power device 101a has three operation modes as illustrated in FIG. 3C, i.e., a nominal current mode, a saturation current mode and a surge current mode, depending in the applied gate voltage Vg and collector current Ic. For the nominal current mode, a gate voltage Vg between the first threshold Vth1 and the second threshold voltage Vth2 is applied and a collector current Ic resulting in a collector emitter Voltage Vce between the first collector emitter Voltage Vce1 and the second collector emitter Voltage Vce2 is applied. That is, the power device 100 is able to conduct a nominal current or rated current. In the saturation current mode, a gate voltage Vg between the first threshold Vth1 and the second threshold voltage Vth2 is applied and a collector current Ic resulting in a collector emitter Voltage Vce higher than the second collector emitter Voltage Vce2 is applied. That is, the power device 100 is able to conduct a saturation current Isat being larger than the nominal current but being specifically low enough to ensure a proper short circuit robustness of the device by limiting the dissipated power in a short circuit substantially incident over the specified short-circuit time to below a critical destruction energy of the device. The saturation current may thus be limited by the power device itself by channel pinch-off. This power device property may be used to withstand low-inductive short-circuit events (e.g. DC-link short circuits) and limit the occurring currents for some microseconds. For the surge current mode, a gate voltage Vg higher than the second threshold voltage Vth2 is applied and a collector current Ic resulting in a collector emitter Voltage Vce between the first collector emitter Voltage Vce1 and the second collector emitter Voltage Vce2 is applied. That is, the power device 100 is able to conduct a surge current being higher than the saturation current Isat of the switchable cells 101a of the first switchable region.

FIGS. 3D to 3H illustrate the operation of the power device for an increasing gate voltage Vg.

Figure 3B:
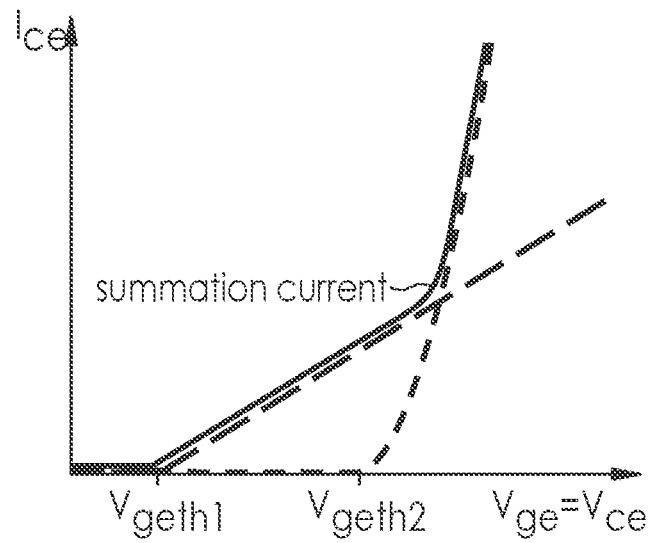
Figure 3D:
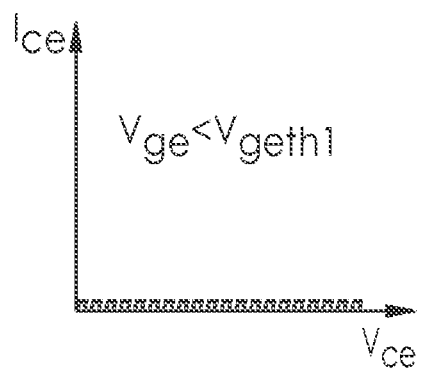

As shown in FIG. 3D, for a gate voltage Vg applied to the power device 100 that is lower than the first threshold Vth1, substantially no collector current Ic is conducted by the switchable cells 101a of the first switchable region and the switchable cells 101b of the second switchable region.

Figure 3E:
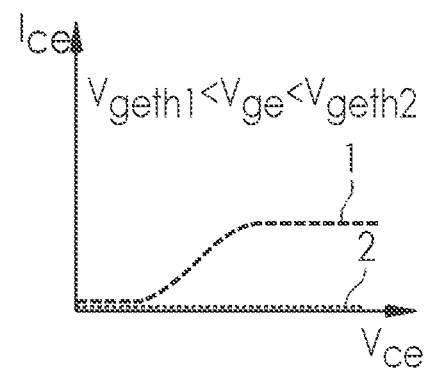

As shown in FIG. 3E, for a gate voltage Vg that is larger than the first threshold Vth1 but smaller than the second threshold Vth2, a collector current Ic is conducted by the switchable cells 101a of the first switchable region but no collector current Ic is conducted by the switchable cells 101b of the second switchable region. That is, the power device 100 is operable to conduct the rated current.

Figure 3F:
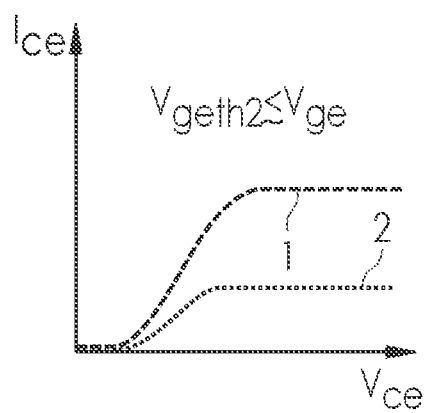

As shown in FIG. 3F, for a gate voltage Vg that is slightly above the second threshold Vth2, a collector current Ic starts to be conducted by the switchable cells 101b of the second switchable cells. Specifically, the collector current Ic conducted by the switchable cells 101b of the second switchable region may be smaller than the collector current Ic conducted by the switchable cells 101a of the first switchable region for a gate voltage that is just above the second threshold Vth2. Further, due to the increased gate voltage Vg compared to the case depicted in FIG. 3E, the collector current Ic conducted by the switchable cells 101a of the first switchable region may be larger than the one conducted in the case depicted in FIG. 3E. However, for a further increasing gate voltage Vg, the relation between the collector current Ic conducted by the switchable cells 101a of the first switchable region and the switchable cells 101b of the second switchable region may be different.

Figure 3G:
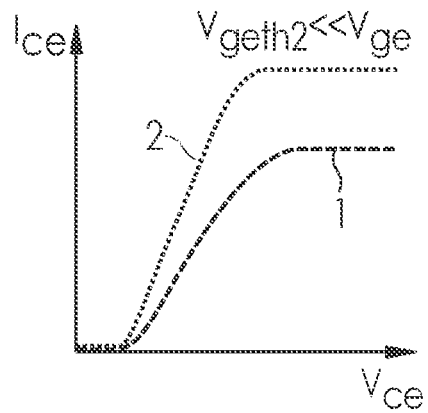

Specifically, as shown in FIG. 3G, for a gate voltage Vg that is larger than the second threshold Vth2, a collector current Ic conducted by the switchable cells 101b of the second switchable region may be larger than the collector current Ic conducted by the switchable cells 101a of the first switchable region. Specifically, for an gate voltage Vg exceeding the second threshold Vth2, the collector current Ic conducted by the switchable cells 101b of the second switchable region may be several times higher as the collector current Ic conducted by the switchable cells 101a of the first switchable region. That is, the power device is operable to conduct the surge current, which is at least five times, specifically ten times, preferably ten to twenty times as large as the rated current.

Accordingly, the rated current may correspond to the collector current Ic conducted by the switchable cells 101a of the first switchable region for a gate voltage Vg larger than the first threshold Vth1 but smaller than the second threshold Vth2, whereas the surge current may correspond to the collector current Ic conducted by the switchable cells 101a of the first switchable region and the switchable cells 101b of the second switchable region for a gate voltage Vg larger than the second threshold Vth2. For gate voltages Vg exceeding the second threshold Vth2, e.g., by a few volts, the surge current may be dominated or mainly determined by the collector current Ic conducted by the switchable cells 101b of the second switchable region.

Figure 3H:
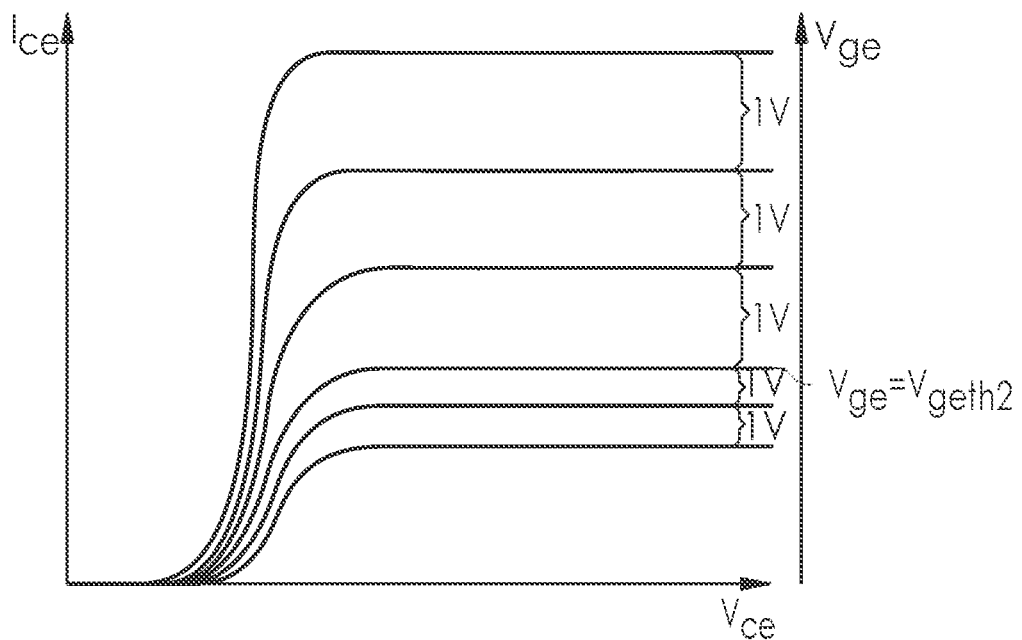

As shown in FIG. 3H, the increase of the saturation current Isat of the power device 100 per arbitrary unit of gate Voltage Vg is higher for gate voltages Vg above the second device threshold Vth2 than for gate voltages Vg between the first threshold Vth1 and the second device threshold Vth2. That is, the current conducting ability of the power device 100 is improved by the switchable cells 101b of the second switchable region for gate voltages above the second device threshold Vth2. This may be facilitated by a slope (in the transfer characteristic) of the switchable cells 101b arranged in the second switchable region being higher than a slope of the switchable cells 101a arranged in the first switchable region, as shown in FIG. 3B. In other words, a transconductance of the switchable cells 101b of the second switchable region is higher than a transconductance of the switchable cells 101a of the first switchable region. Thus, for each arbitrary increase of the gate voltage Vg above the second threshold Vth2, the increase of the collector current Ic conducted by the switchable cells 101b arranged in the second switchable region is higher than the increase of the collector current Ic conducted by the switchable cells 101a arranged in the first switchable region.

Figure 4:
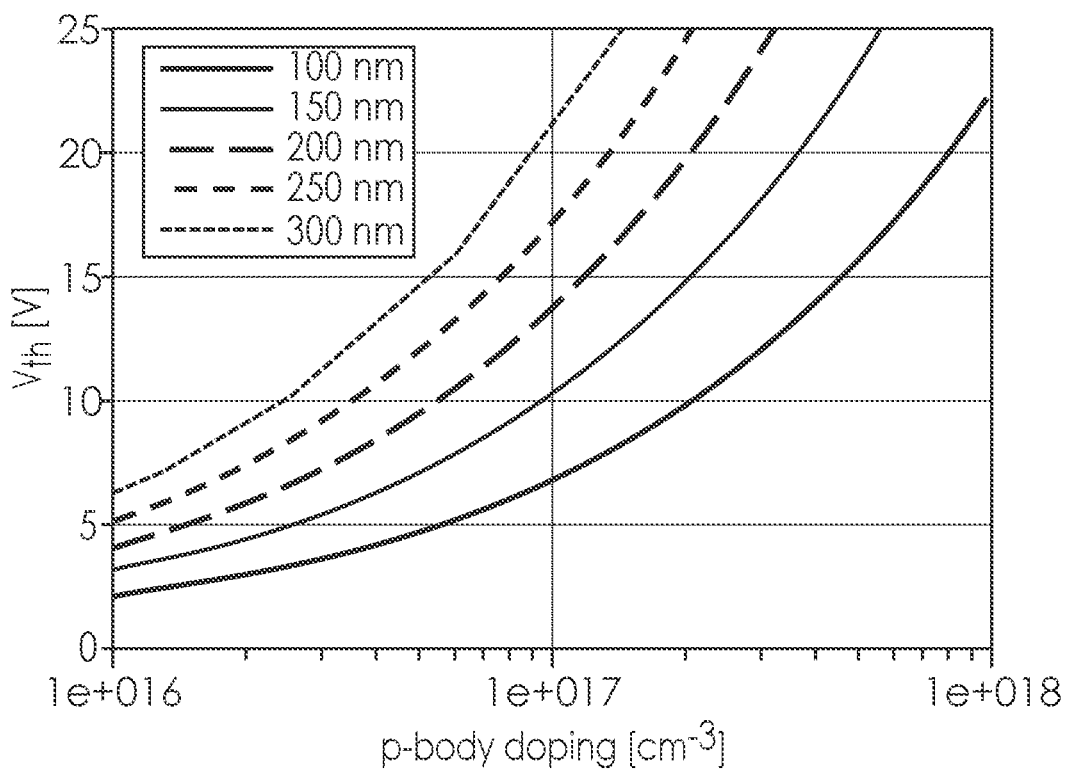
FIG. 4 illustrates a graph showing a threshold voltage of a power device, according to an embodiment.

FIG. 4 shows a graph of a dependency of the threshold voltage on a doping concentration of the body region and/or a thickness of the gate insulation layer. For example, the transfer characteristics shown in FIG. 4 may be of a power device, such as an IGBT (insulated-gate bipolar transistor) that is designed for voltages about 4.5 kV.

As can be seen from FIG. 4, the threshold voltage of a switchable cell 101a, 101b may be varied by varying a doping concentration of the body region 312 and/or a thickness of the gate insulation layer 315c. Specifically, the threshold Vth1 and Vth2 may be increased with increasing doping concentration of the body region 312 and/or with increasing thickness of the gate insulation layer 315c. For example, a threshold voltage of a switchable cell in the first switchable region, i.e., the first threshold Vth1, may be increased during manufacturing of the power device such that the respective switchable cell becomes a switchable cell of the second switchable region.

Accordingly, it is possible to manufacture a power device having the first and second switchable region on a single chip. Specifically, it is possible to manufacture the power device having the first and the second switchable region by using almost the same processing steps for the first and the second switchable region and altering some processing steps. For example, additional masking steps may be introduced to apply a different dopant concentration of the body region 312 to the first switchable region and the second switchable region.

FIGS. 5A to 5D show switchable cells according to embodiments.

Figure 5A:
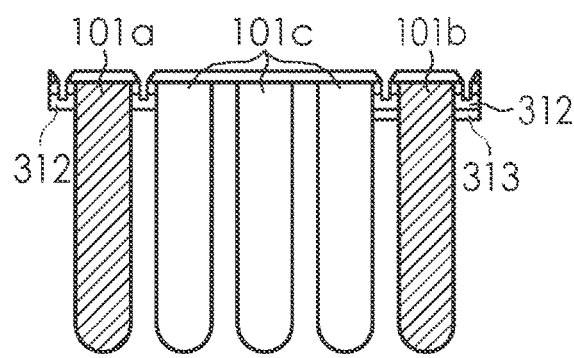
FIGS. 5A to 5D illustrate switchable cells of a power device, according to an embodiment.
Figure 5B:
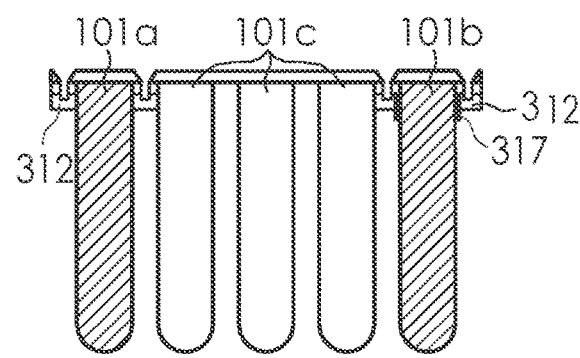
Figure 5C:
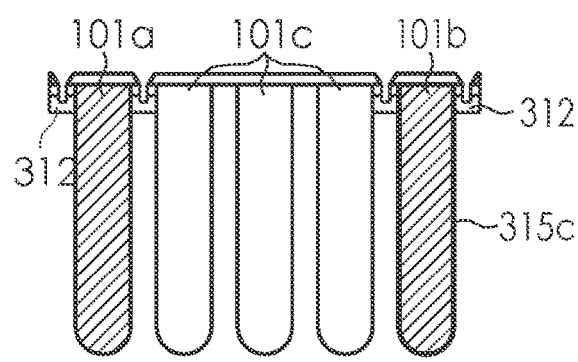

FIGS. 5A to 5D each show on the left side a switchable cell 101a of the first switchable region and on the right side a switchable cell 101b of the second switchable region. In the shown examples, the switchable cells 101a, 101b are of the trench type, i.e., a trench type power device is provided. However, the same concept is applicable to planar power devices. Further, the power device 100 may include dead or non-active cells 101c to be described later in further detail. In FIGS. 5A to 5C, the dead cells 101c are provided between the switchable cell 101a of the first switchable region and the switchable cell 101b of the second switchable region.

According to an embodiment shown in FIG. 5A, which can be combined with other embodiments, each body region 312 includes a p body region 313 having a higher doping concentration than the body region 312, wherein portions of the p body region 313 of the switchable cells 101a arranged in the first switchable region have a doping concentration which is different to a doping concentration of portions of the p body regions 313 of the switchable cells 101b arranged in the second switchable region. In a typical embodiment, the p body region 313 may be sandwiched between the body region 312 and the drift region 306 as shown in FIG. 5A or may replace the body region 312 or may be separated from the drift region 306 by the body region 312 or may lie within the body region 312. That is, substantially, the doping concentration of the effective body region of the switchable cells 101b of the second switchable region may be increased compared to the switchable cells 101a of the first switchable region.

Preferably, the portions of the p body regions 313 of the switchable cells 101b arranged in the second switchable region have a doping concentration which is higher than a doping concentration of the portions of the p body regions of the switchable cells 101a arranged in the first switchable region. Thus, a second threshold Vth2 of the second switchable region than the first threshold Vth1 of the first switchable region ca be obtained. Further, a latch-up stability of the switchable cells 101b of the second switchable region can be improved. Further the latch-up robustness of the switchable cells 101b of the second switchable region (which may provide more n-source zones and are, hence, more prone to latch-up) can be reduced by the increased p-body doping.

According to an embodiment shown in FIG. 5B, which can be combined with other embodiments, each body region includes a channel region 317 next to the gate electrode structure 315 of the switchable cells 101a, 101b, wherein portions of the channel regions 317 of the switchable cells 101a arranged in the first switchable region have a doping concentration which is different to a doping concentration of portions of the channel regions 317 of the switchable cells arranged in the second switchable region.

Preferably, the portions of the channel regions 317 of the switchable cells 101b arranged in the second switchable region have a doping concentration which is higher than a doping concentration of the portions of the channel regions 317 of the switchable cells 101a arranged in the first switchable region. Thus, a second threshold Vth2 of the second switchable region than the first threshold Vth1 of the first switchable region ca be obtained.

According to an embodiment shown in FIG. 5C, which can be combined with other embodiments, the switchable cells each includes the gate insulation layer 315c. Preferably, the gate insulation layer 315c of the switchable cells 101b arranged in the second switchable region has a thickness which is higher than a thickness of the gate insulation layer 315c of the switchable cells 101a arranged in the first switchable region. Thus, a second threshold Vth2 of the second switchable region is higher than the first threshold Vth1 of the first switchable region ca be obtained.

According to an embodiment shown in FIG. 5C, which can be combined with other embodiments, the switchable cells 101a, 101b each includes the gate insulation layer 315c, the gate insulation layer 315c of the switchable cells 101a arranged in the first switchable region has a dielectric constant which is different to a dielectric constant of the gate insulation layer 315c of the switchable cells 101b arranged in the second switchable region. Thus, a second threshold Vth2 of the second switchable region is different than the first threshold Vth1 of the first switchable region can be obtained.

Figure 5D:
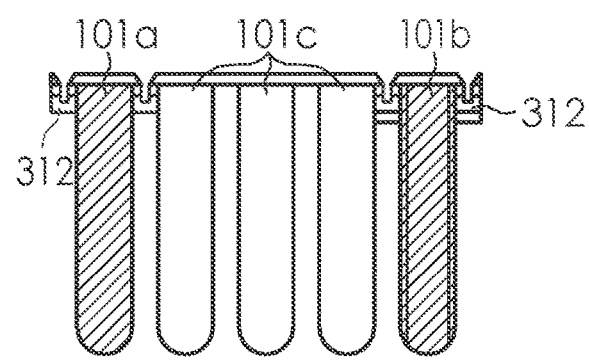

According to an embodiment shown in FIG. 5D, which can be combined with other embodiments, the switchable cells of the second switchable region each include the gate electrode structure 315. Preferably, gate electrode structure 315 of the switchable cells 101b of the second switchable region has floating gates. Thus, a second threshold Vth2 of the second switchable region, depending on the (fixed) charge state of the floating gate structures, is different than the first threshold Vth1 of the first switchable region can be obtained.

According to an embodiment, which can be combined with other embodiments, the first switchable region includes a first surface area a1 of the semiconductor substrate 301, the second switchable region includes a second surface area a2 of the semiconductor substrate 301. In a conventional power device designed for short-circuit ruggedness and normal operation, only about 20% of the available surface area is used by the switchable cells. Accordingly, it is possible to use the remaining surface area as the second switchable region. Thus, a power device having first and second switchable regions can be obtained without increasing the total size of the power device.

Herein, the first and second switchable regions are not thought to be closed or separated regions. Specifically, the switchable cells of the first and second switchable regions may be distributed completely random over the surface area of the power device 100 or according to a predetermined distribution pattern.

Typically, the switchable cells 101a of the first switchable region are similar to the switchable cells of a conventional power device with regard total amount, spatial density and channel width. Preferably, a distance between two adjacent switchable cells 101a of the first switchable region is smaller than the diffusion length of the minority charge carriers of the respective switchable cells 101a, 101b. Thereby, a small voltage drop of the power devices in the normal mode can be achieved.

Preferably, the second surface area a2 is larger than the first surface area a1. This is particularly preferably in the case that the conductable current per switchable cell 101a of the first switchable region is comparable to the conductable current per switchable cell 101b of the second switchable region. Accordingly, even if the conductable current per switchable cell 101b in the second switchable region is not higher than the one in the first switchable region, a higher current can be conducted by the sum of the switchable cells 101b of the second switchable region that of the sum of the switchable cells 101a of the first switchable region. Accordingly, a surge current being higher than the rated current, specifically at least five times as large as the rated current, can be conducted at comparably low losses.

Figure 6A:
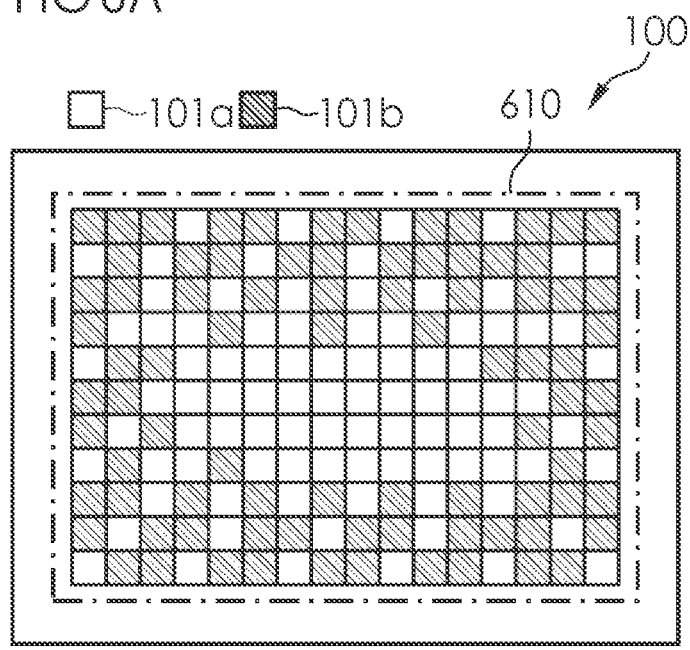
FIGS. 6A to 6B illustrate top views onto a power device according to an embodiment with increased area ratio of the second switchable regions towards the edge termination of the second, according to an embodiment.
Figure 6B:
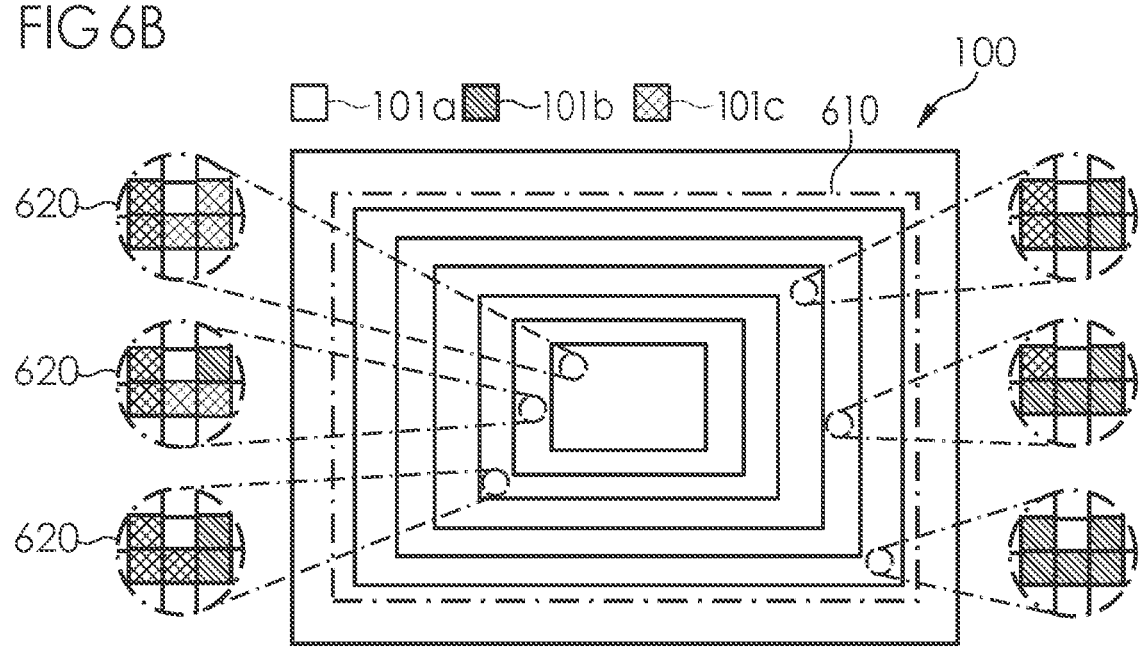

FIGS. 6A and 6B illustrates top views onto a power device 100. The switchable cells 101b arranged in the second switchable region and the switchable cells 101a arranged in the first switchable region can be distributed randomly or arbitrary over the active area. Thus, the first switchable region and the second switchable region may not be considered as self-contained areas but may be considered as the sum of the area occupied by the respective switchable cells.

According to an embodiment shown in FIG. 6A, which can be combined with other embodiments, the power device 100 further includes an edge termination 610, wherein a relative ratio of the switchable cells 101b arranged in the second switchable region to the switchable cells 101a arranged in the first switchable region is higher in a region near the edge termination 610 than a ratio of a of the switchable cells 101b arranged in the second switchable region to the switchable cells 101a arranged in the first switchable region arranged in the active area. Thereby, a reduced charge carrier density in or near the edge termination 610 in normal operation can be provided. Accordingly, a reduced dynamic avalanche due to high dynamic robustness principle can be achieved increasing the switching robustness of the power device. Generally, in surge-current operation, the power device should not be switching robust. Thus, the current density at the edge termination 610 may be increased in surge-current mode. Thus, an optimized utilization of the surface area can be achieved.

According to an embodiment shown in FIG. 6B, which can be combined with other embodiments, the power device 100 further includes a unit cell 620 composed of a plurality of switchable cells 101a, 101b. Although six switchable cells 101a, 101b per unit cell 620 are shown in the embodiment of FIG. 6B, a unit cell 620 may include any number of switchable cells 101a, 101b. Preferably, unit cell 620 includes five switchable cells 101a, 101b. As shown in FIG. 6B, the ratio of the number of switchable cells 101a of the first switchable region to the number of the switchable cells 101b of the second switchable region may vary per unit cell 620.

For example, in a region located in the middle, i.e. distinct from the edge termination 610 in the respective spatial directions, the number of switchable cells 101a of the first switchable region may be, e.g., several times, higher than the number of the switchable cells 101b of the second switchable region per unit cell 620. Further, in a region located near the edge termination, the number of switchable cells 101a of the first switchable region may be, e.g. several times, lower than the number of the switchable cells 101b of the second switchable region per unit cell 620. Specifically, a unit cell 620 in the middle may include one switchable cell 101b of the second switchable region, whereas the remaining cells are switchable cells 101a of the first switchable cells. Further, a unit cell 620 near the edge termination 620 may include one switchable cell 101a of the first switchable region, whereas the remaining cells are switchable cells 101b of the second switchable cells. That is, the number of switchable cells 101b of the second switchable region per unit cell 620 increases from unit cells 620 that are located in the middle to unit cells 620 that are located near the edge termination. Thereby, the beneficial effects disclosed with reference to FIG. 6A may be achieved while providing an easy producible and reproducible layout.

Further, as shown in FIG. 6B, a unit cell 620 may also include dead cells 101c that are neither switchable cells 101a of the first switchable region nor switchable cells 101b of the second switchable region. That is, a unit cell 620 may also include dead cells 101c that may not contribute to the active area of the power device. Specifically, the total amount of switchable cells 101a of the first switchable region may be uniformly distributed, i.e. each unit cell 620 may include the same number or amount of switchable cells 101a of the first switchable region. The remaining cells may be switchable cells 101b of the second switchable region or dead cells 101c.

In the embodiment shown in FIG. 6B, all unit cells 620 may include one switchable cell 101a of the first switchable region, whereas the remaining cells may be switchable cells 101b of the second switchable region or dead cells 101c that are interchanged with each other. That is, a dead cell 101c may be replaced by a switchable cell 101b of the second switchable region and vice versa depending on the location of the respective unit cell 620. Specifically, a unit cell 620 located in the middle may include one switchable cell 101a of the first switchable region and dead cells 101c, whereas a unit cell 620 located near the edge termination 610 may include one switchable cell 101a of the first switchable region and switchable cells 101b of the second switchable region. That is, the dead cells 101c may be iteratively replaced by switchable cells 101b of the second switchable region from unit cells 620 located in the middle to unit cells 620 located near the edge termination 610.

Preferably, from the total amount of cells, i.e., switchable cells 101a of the first switchable region, switchable cell 101b of the second switchable region and dead cells 101c, about 10 to 30%, specifically 15 to 25%, preferably about 20%, are switchable cells 101a of the first switchable region that are homogeneously distributed. Further, from the total amount of cells, about 70 to 90%, specifically, 75 to 85%, preferably about 80% may be switchable cells 101b of the second switchable region.

According to an embodiment, which can be combined with other embodiments, the power device 100 further includes a gate bus structure in ohmic contact with the gate electrode structure 315 of the switchable cells 101a, 101b, wherein a relative ratio of the switchable cells 101b arranged in the second switchable region to the switchable cells 101a arranged in the first switchable region is higher in a region near the gate bus structure than a mean ratio of the switchable cells 101b arranged in the second switchable region to the switchable cells 101a arranged in the first switchable region arranged in the active area. Thereby, a reduced charge carrier density near or at the gate bus structure can be provided. Accordingly, a reduced dynamic avalanche due to high dynamic robustness principle can be achieved. Thus, an optimized utilization of the surface area can be achieved.

For example, the power device 100 may be embodied in a fault protecting circuit 700 as shown in FIG. 7. According to an embodiment, which can be combined with other embodiments, the power device 100 may be connectable with input terminals 712, 714 of a power system 710 to be protected by the fault protecting circuit 700. The fault protecting circuit 700 may further include a gate driver circuit 702 for applying a gate Voltage Vg to the power device 100. The gate driver circuit 702 may be connected via a resistor 704 to the power device 100. A power input 706 may be provided and may be connected to the input terminals 712, 714 for powering the power system 710.

The fault protecting circuit 700 may further include a detection circuit 720 operable to detect an overvoltage or overcurrent event which can damage the power system. Specifically, the detection circuit 720 may be operable to apply a gate voltage Vg equal to or higher than the second threshold Vth2 of the power device 100 so that a surge current can be conducted between the input terminals 712, 714 of the power system. Beneficially, the detection circuit 720 may be connected to the gate driver circuit 702 to control the gate voltage Vg output from the gate driver circuit 702. Although the detection circuit 720 and the gate driver circuit 702 are illustrated separately in FIG. 7, the gate driver circuit 702 may also be implemented in the detection circuit 720 and/or the detection circuit 720 may be operable to apply a voltage to the gate of the power device 100.

According to an embodiment, which can be combined with other embodiments, the detection circuit is operable to apply a voltage equal to or higher than the second threshold if the detection circuit detects that an overcurrent lasting for more than a predetermined time which would lead to a damage of the power system 710. Typically, the overcurrent condition may be present for only a short time, e.g. a few to a few hundred microseconds, i.e., 500 µs, 1 ms, specifically 10 ms, preferably 100 ms. Accordingly, the detection circuit may be operable to distinguish between such a short overcurrent condition and an overcurrent condition that last longer, specifically a few to a few hundred milliseconds or more. Preferably, the detection circuit may be operable to distinguish between short overcurrent condition and a overcurrent condition that last for more than 500 µs, in particular more than 1 ms, specifically more than 10 ms, preferably more than 100 ms. In general, it is desirable to protect the power system from a current that may cause damage to the power system. Further to the above mentioned time component, the value of the overcurrent may be additionally or alternatively of interested. That is, in determining whether the power system should be protected or not, the application of the energy of the current may be considered. In such a case, the voltage equal to or higher than the second threshold will be applied for the case of the longer lasting overcurrent condition. Accordingly, the switchable cells of the second switchable region become only conductive for the case of the long lasting and critical overcurrents which would damage the power system 710. By power device turn-on, the input (712, 714) of the system 710 is shorted and protected against high currents. In case of an overvoltage for the system 710, the detection circuit 720 may be operable to apply a voltage equal to or higher than the second threshold Vth2 as soon as the detection circuit 720 detects the overvoltage. Hence, the power device shorts the input (712, 714) of the system 710 and protects it.

Figure 8A:
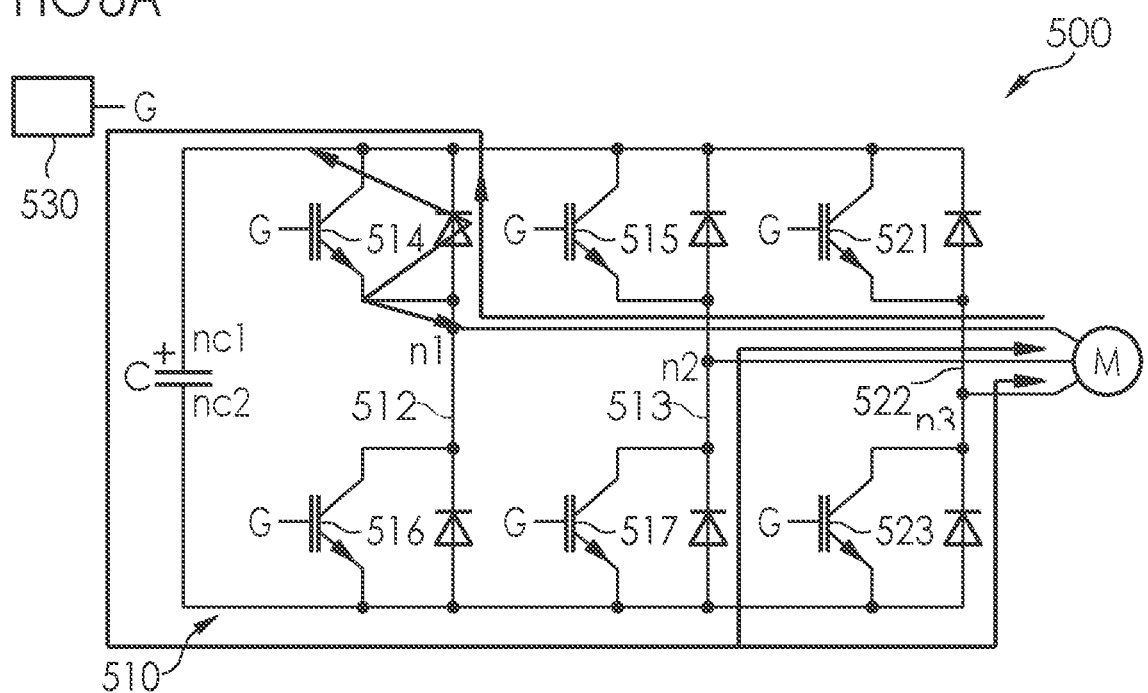
FIGS. 8A to 8C illustrate a power inverter, according to an embodiment.
Figure 8B:
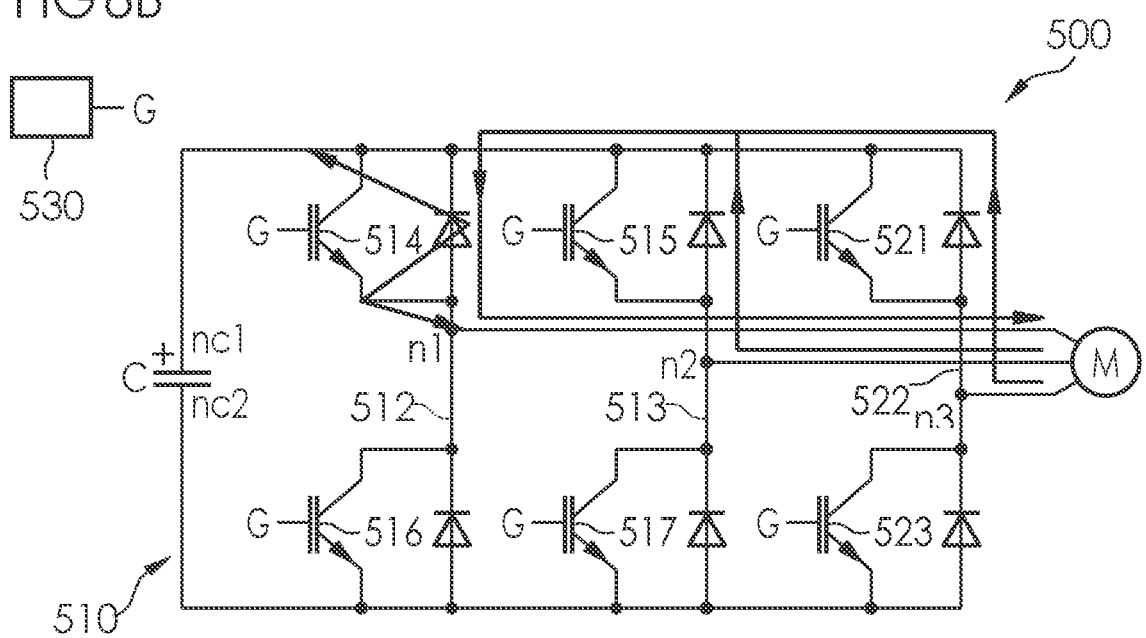
Figure 8C:
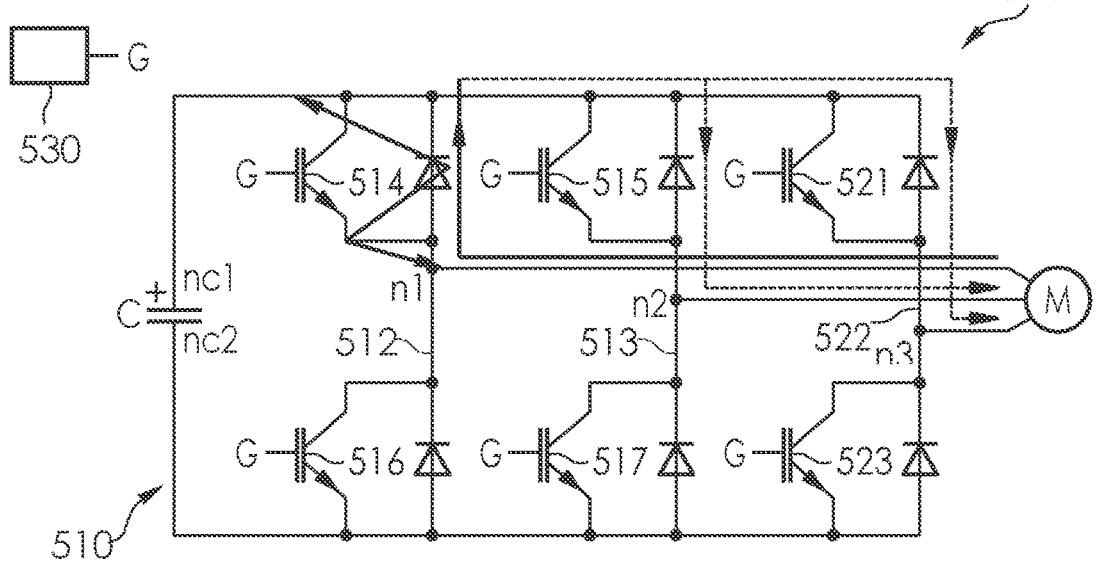

FIGS. 8A to 8C show a power inverter or power converter.

According to an embodiment, which can be combined with other embodiments, the power inverter 500 or power converter 500 includes a bridge circuit 510 and a gate driver circuit 530.

The bride circuit 510 includes a first half-bridge 512 having a high-side power device 514 connected between a first node n1 and a high-side node nc1 of an intermediate circuit storage C, and a low-side power device 516 connected between the first node n1 and a low-side node nc2 of the intermediate circuit storage C. The bride circuit 510 further includes at least a second half-bridge 513 with a high-side power device 515 connected between a second node n2 and the high-side node nc1 of the intermediate circuit storage C, and a low-side power device 517 connected between the second node n2 and the low-side node nc2 of the intermediate circuit storage C. The bride circuit 510 may further include at least a third half-bridge including a high-side power device connected between a third node and the high-side node nc1 of the intermediate circuit storage C, and a low-side power device connected between the third node and the low-side node nc2 of the intermediate circuit storage C. The first, second and third half-bridges may be connected to phases of an electric device M, such as an motor or generator. Preferably, the number of half-bridges corresponds to the number of phases of the electric device M. The number of phases of the electric device M and the number of half-bridges may be three.

The gate driver circuit 530 is connected with each gate or gate electrode structure 315 of the high-side and low-side power devices 514, 515, 516, 517 of the first and second half-bridges 512, 513 and operable to provide each gate with a respective voltage to control operation of the respective power device 514, 515, 516, 517 (the connections of the gate driver circuit 530 and the gate or gate electrode structure 315 of the high-side and low-side power devices 514, 515, 516, 517 are schematically illustrated in FIGS. 8A to 8C as connection "G"). Specifically, the gate driver circuit 530 may be connected to the gate electrode structures of all power devices of the bridge circuit 510. The gate driver circuit 530 is operable to provide a first voltage which is higher than the first threshold voltage Vth1 of the respective power device 514, 515, 516, 517 at which the respective power device 514, 515, 516, 517 becomes conductive for continuously conducting the rated current of the respective power device 514, 515, 516, 517, and a second voltage which is higher than a surge threshold Vth2 of the respective power device 514, 515, 516, 517, wherein the surge threshold Vth2 is at least two times as high as the first threshold Vth1 and defines the onset of a surge current operation area of the respective power device 514, 515, 516, 517 at which the respective power device 514, 515, 516, 517 becomes operable to conduct a surge current which is at least five times, specifically ten times, preferably 10 to 20 times, more preferably 25 times or even higher, as large as the rated current of the respective power device 514, 515, 516, 517.

Moreover, the power inverter 500 may include further half-bridges each including a high side and a low side power device. The power inverter 500 shown in FIGS. 8A to 8C includes three half-bridges, i.e., the aforementioned first and second half-bridges 512, 514 and a third half-bridge 522. As above, the third half-bridge 522 includes a high-side power device 521 connected between a third node n3 and the high-side node nc1 of the intermediate circuit storage C, and a low-side power device 523 connected between the third node n2 and the low-side node nc2 of the intermediate circuit storage C. Specifically, the number of half-brides may correspond to the number of phases of the coupled electric device M.

For example, a spontaneous semiconductor failure (cosmic ray failure, diode failure during reverse-recovery period, see FIG. 8A; power device 514 is shorted) can cause a DC-link short circuit in a converter. Due to very high short-circuit currents and subsequent stress for converter components (bus-bars, semiconductors, etc.) this type of short circuit is preferred to be prevented. Hence, the short-circuit capability of the power device (516 in FIG. 8A) is utilized to limit the occurring current and to turn-off the DC-link short circuit within microseconds. After such an event, all remaining power devices are turned off and stay in pulse-blocking mode. Therefore, current paths with and without DC-link capacitor can occur, see arrows in FIG. 8A. However, this results in an asymmetric short circuit of the motor/generator load and may cause alternating torques, which can become critical for possible applications, such as a generator in a wind turbine), and should therefore be avoided.

As shown in FIGS. 8B and 8C, one way to symmetrize the load's short circuit is to apply a gate voltage Vg higher than the second threshold Vth2 to the high-side power devices 514, 515 of the first and second half-bridges 512, 513. In case of a destructed semiconductor at position T1 (514), the high-side power devices 514, 515 are turned on (see arrows in FIG. 8C). On the other hand, the low-side power devices 516, 517 are turned on in the case of destructed semiconductor at position T4 (516). Hence, all phases of the load are shortened for all current directions, only once a braking torque occurs.

According to embodiments, which can be combined with other embodiments, the power inverter further includes a detection circuit operable to distinguish between a short-circuit and a surge-current event in the bridge circuit, wherein the detection circuit is operable to control the gate driver circuit to provide the second voltage if the detection circuit detects the surge-current event. Specifically, the short-circuit is a relative short event, e.g., an event that lasts for a few to a few microseconds (e.g. 10 µs), whereas the surge-current event is a relative long lasting event, e.g., an event that lasts for a few to a few hundred milliseconds or more. Accordingly, the short-circuit has a duration that is significantly smaller than a duration of the surge-current event.

For detection of a surge-current event, the measurement of the collector current slope can be used. For a DC-link short-circuit case, the slope is typically several times higher than for the surge-current case. In short-circuit case, the collector current slope (dIc/dt) may be higher than a critical value and the protection circuit may keep the gate voltage Vg below the second threshold Vth2 and may turn off the power device after some microseconds. For surge-current case, the collector current slope is typically smaller than a critical value. The protection circuit may increase the gate voltage Vg to a value above the second threshold Vth2.

Hence, the switchable cells 101a of the first switchable region and the switchable cells 101b of the second switchable region become active and a surge current can be conducted with low losses.

In accordance with an embodiment, there is provided a method for operating a power inverter 500. The power inverter 500 includes a bridge circuit 510 with a first half-bridge 512 having a high-side power device 512 connected between a first node n2 and a high-side node nc1 of an intermediate circuit storage C, and a low-side power device 516 connected between the first node n1 and a low-side node nc2 of the intermediate circuit storage C, and at least a second half-bridge 513 including a high-side power device 515 connected between a second node n2 and the high-side node nc1 of the intermediate circuit storage C, and a low-side power device 517 connected between the second node n2 and the low-side node nc2 of the intermediate circuit storage C. A collector-emitter voltage Vce and/or a collector current Ic are/is detected. Furthermore, it is determined whether an overcurrent or overvoltage conditions has been met. Specifically, it can be determined if a temporal change of the collector-emitter voltage dVce/dt is below a predetermined threshold (dVce/dt)_crit and/or if a temporal change of the collector current dIc/dt is below a predetermined threshold (dIc/dt)_crit and/or if the collector current at the time of the start of the desaturation of the affected power device plus a prespecified time delay Ic(t_ent+delta_t) is below a predetermined threshold Ic_crit, i.e. if Vce dVce(t)/dt<(dVce/dt) crit, and/or dIc(t)/dt<(dIc/dt) crit, and/or Ic(t_ent+delta_t)<Ic crit holds true.

Considering the first condition, it is checked whether the speed of the increase of the collector emitter voltage Vce of the affected power device of the respective half-bridge through which the short circuit current flows is potentially lower at the time of desaturation t_ent of this power device than the prespecifiable critical value. Considering the second condition, it is checked whether the speed of the increase of the collector current Ic of the affected power device of the respective half-bridge through which the short circuit current flows is potentially lower than a prespecifiable critical value. And, considering the third condition, it is checked whether the collector current Ic at the time after expiration of the time delay delta t upon the start of the desaturation of the affected power device of the respective half-bridge through which the short circuit current flows is smaller than a prespecifiable critical value. These conditions can be checked, for example, by the detection circuit.

If at least one of the aforementioned conditions has been met, the gate voltage Vg of one of the power devices 512, 514, 513, 517 is increased above a surge threshold Vth2 defining the onset of a surge current operation area of the respective power device 512, 514, 513, 517.

By increasing the gate voltage Vg above the surge threshold Vth2, the affected power device 512, 514, 513, 517 becomes operable to conduct a surge current which is at least five times as large as a rated current of the respective power device which is conducted by the respective power device 512, 514, 513, 517 during normal operation, i.e., for a applied gate voltage Vg above a first threshold Vth1 but below the surge threshold Vth2. Thereby, a desaturation and the subsequent destruction of said element can be avoided. Consequently, the power inverter can be controlled in a state in which those connections of the power inverter 500 to which the load has been connected are short-circuited. The resultant short circuit currents flowing across the load can thus develop symmetrically. If the load is an electric motor or a generator, the state of symmetry of the power rectifier has the effect that smaller torque changes occur on the load.

Therefore, the power inverter 500 can be moved into the position of detecting a branch short circuit and of switching off the appropriate power device(s), on the one hand, as well as-in case of a load short circuit-of increasing the gate-emitter voltage of one of the power devices, on the other hand, and of thus being able to achieve a symmetrization of the motor or generator's, i.e. load's, short circuit currents.

Thus, by increasing the gate voltage Vg above the surge threshold Vth2, it is possible to prevent a desaturation and the subsequent destruction of power device due to high load-driven currents.

Figure 9:
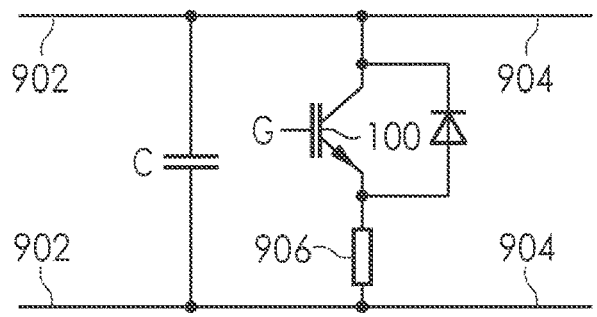
FIG. 9 illustrates a chopper circuit, according to an embodiment.

FIG. 9 illustrates a chopper circuit. According to an embodiment, which can be combined with other embodiments, a chopper circuit 900 includes a first input terminal 902 for connecting with a power supply, a first output terminal 904 for connecting with a load, and the power device 100. The power device 100 may be electrically connected in parallel with the first input terminal and the first output terminal.

The chopper circuit 900 may further include a brake resistor 906 connected in series with the power device 100. According to an embodiment, which can be combined with other embodiments, the chopper circuit may be connected in parallel to a capacitance C. Specifically, the capacitance C may be the capacitance of the embodiments shown in FIGS. 8A to 8C. Accordingly, the chopper circuit 900, specifically the power device 100 and the resistor 906, may be connected in parallel to the capacitance C of the embodiments shown in FIGS. 8A to 8C.

According to an embodiment, which can be combined with other embodiments, a voltage equal to or higher than the second threshold Vth2 is applied to the power device 100 if an overvoltage or overcurrent is detected. In this case, an overvoltage or an overcurrent occurring in the chopper circuit or in a circuit connected to the chopper circuit may be conducted to the brake resistor 906, whereby the energy corresponding to the overcurrent or overvoltage condition may be converted into thermal energy. Thus, the electric circuit connected to the chopper circuit 900 may be protected.

When specifically considering a drive-system, such as a wind turbine, it comes with a velocity "v", so it has a kinetic energy. If the system is slowed down, the excess energy flows in the form of regenerative power from an amplifier back to a DC link. If this voltage exceeds a threshold voltage, the chopper circuit 900 may be switched electronically by applying a voltage equal to or higher than the second threshold Vth2. The excess energy is then converted by the connected brake resistor 906 almost entirely into thermal energy. Conventionally, thyristors may be used as switchable elements. However, thyristors provide the disadvantage of being not easy to control. Specifically, thyristors may not be turned on and off instantly. Accordingly, the present application provides a new switchable power device 100 that may replace a thyristor in common protection circuits.

Figure 10:
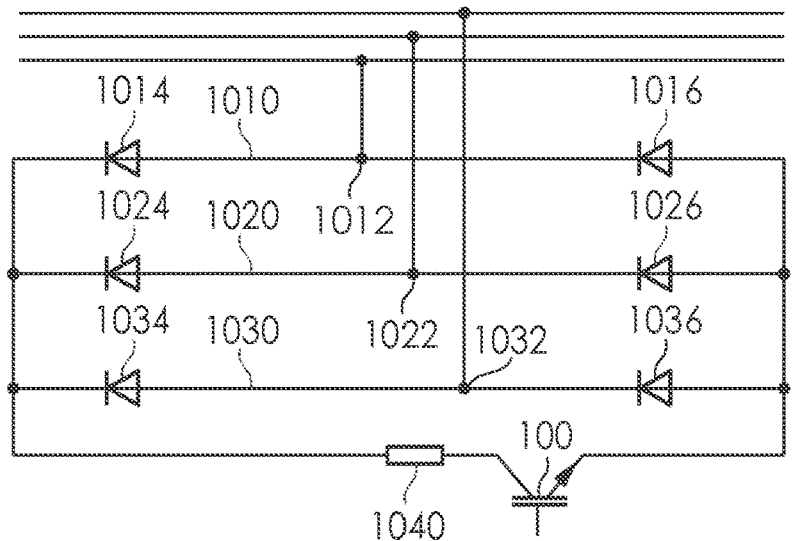
FIG. 10 illustrates a crowbar, according to an embodiment.

FIG. 10 illustrates a crowbar. According to an embodiment, which can be combined with other embodiments, a crowbar 1000 includes a first diode bridge 1010, a first node 1012, and the power device 100. The first diode bridge 1010 may include a first crowbar diode 1014 connected between the first node 1012 and a collector terminal of the power device 100 and a second crowbar diode 1016 connected between the first node 1012 and an emitter terminal of the power device 100. The first node 1012 may be connected to a first phase of an alternate-current (AC) circuit. The collector terminal may be in ohmic contact with the collector region of the power device 100. The emitter terminal may be in ohmic contact the emitter region of the power device 100. Further, a crowbar resistor 1040 may be connected in series with the power device 100. Specifically, the crowbar resistor 1040 may be connected between the collector terminal of the power device 100 and the first crowbar diode 1014.

The crowbar 1000 may further include a second diode bridge 1020 and a second node 1022. The second diode bridge 1020 may include a third crowbar diode 1024 connected between the second node 1022 and the collector terminal of the power device 100 and a fourth crowbar diode 1026 connected between the second node 1022 and the emitter terminal of the power device 100. The second node 1022 may be connected to a second phase of the AC circuit. The crowbar 1000 may further include a third diode bridge 1030 and a third node 1032. The third diode bridge 1030 may include a fifth crowbar diode 1034 connected between the third node 1032 and the collector terminal of the power device 100 and a sixth crowbar diode 1036 connected between the third node 1032 and the collector terminal of the power device 100. The third node 1032 may be connected to a third phase of the AC circuit. Preferably, the number of Ac phases corresponds to the number of diode bridges.

According to an embodiment, which can be combined with other embodiments, a voltage equal to or higher than the second threshold Vth2 is applied to the power device 100 if an overvoltage or overcurrent is detected. In this case, an overvoltage or an overcurrent occurring in the AC circuit may be conducted to the crowbar resistor 1040, whereby the energy corresponding to the overcurrent or overvoltage condition may be converted into thermal energy. Thus, the AC circuit connected to the crowbar 1000 may be protected. That is, during crowbar activation, the AC phases are short circuited through the crowbar 1000, and the currents in the AC circuit are limited accordingly to the crowbar resistor 1040 dimensioning. Specifically, by the power devices according to embodiments, higher currents can be conducted through the power device without reaching the saturation value of the collector current Ic, i.e., without desaturation, during Crowbar Activation.

Spatially relative terms such as "under", "below", "lower", "over", "upper" and the like, are used for ease of description to explain the positioning of one element relative to a second element. These terms are intended to encompass different orientations of the device in addition to different orientations than those depicted in the Figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

The written description above uses specific embodiments to disclose the invention, including the best mode, and also to enable any person skilled in the art to make and use the invention. While the invention has been described in terms of various specific embodiments, those skilled in the art will recognize that the invention can be practiced with modification within the spirit and scope of the claims. Especially, mutually non-exclusive features of the embodiments described above can be combined with each other. The patentable scope is defined by the claims, and can include other examples that occur to those skilled in the art. Such other examples are intended to be within the scope of the claims if they have structural elements that do not differ from the literal language of the claims, or if they include equivalent structural elements with insubstantial differences from the literal languages of the claims.

It is to be understood that the features of the various example embodiments described herein can be combined with each other, unless specifically noted otherwise.

Although specific embodiments have been illustrated and described herein, it will be appreciated by those of ordinary skill in the art that a variety of alternate and/or equivalent implementations can be substituted for the specific embodiments illustrated and described without departing from the scope of the present invention. This application is intended to cover any adaptations or variations of the specific embodiments discussed herein. Therefore, it is intended that this invention be limited only by the claims and the equivalents thereof.

What is claimed is:

1. A power inverter, comprising:
   a bridge circuit comprising
      a first half-bridge comprising a high-side power device connected between a first node and a high-side node of an intermediate circuit storage, and a low-side power device connected between the first node and a low-side node of the intermediate circuit storage; and
      at least a second half-bridge comprising a high-side power device connected between a second node and the high-side node of the intermediate circuit storage, and a low-side power device connected between the second node and the low-side node of the intermediate circuit storage; and
   a gate driver circuit connected with each gate of the high-side device and low-side power device of the first and second half-bridges and operable to provide each gate with a respective voltage to control operation of the respective power device, wherein the gate driver circuit is operable to provide a first voltage which is higher than a first threshold voltage of the respective power device at which the respective power device becomes conductive for continuously conducting a rated current of the respective power device, and a second voltage which is higher than a surge threshold of the respective power device, wherein the surge threshold is at least two times as high as the first threshold and defines the onset of a surge current operation area of the respective power device at which the respective power device becomes operable to conduct a surge current which is at least five times as large as the rated current of the respective power device.

2. The power inverter according to claim 1, further comprising a detection circuit operable to distinguish between a short-circuit and a surge-current event in the respective half-bridge circuit, wherein the detection circuit is operable to control the gate driver circuit to provide the second voltage if the detection circuit detects the surge-current event.

3. The power inverter according to claim 2, wherein the gate driver circuit is operable to control the gate driver circuit to provide the second voltage if the detection circuit detects that the overcurrent lasts for more than a predetermined time.

4. The power inverter according to claim 3, wherein the predetermined time is at less than or equal to 500 µs.

5. The power inverter according to claim 1, wherein the first threshold voltage is in the range of 5 V to 10 V, and wherein the second threshold is in the range of 15 V to 25 V.

6. The power inverter according to claim 1, wherein the high-side power devices and the low-side power devices of the first and second half-bridges are each formed in an active area of a semiconductor body that comprises a first switchable region and a second switchable regions different to the first switchable region, wherein the first switchable region comprises switchable cells that turn on at the first threshold voltage, and wherein the second switchable region comprises switchable cells that turn on at the second threshold voltage.

7. The power inverter according to claim 6, wherein the semiconductor body comprises an edge termination region that surrounds the active area, and wherein, when seen in a plane projection onto a main surface of the semiconductor substrate, an area ratio of an area covered by second switchable regions to an area covered by the first switchable regions is higher in an outer region of the active area near the edge termination than in an inner region of the active area, which is arranged spaced from the edge termination.

8. A method for operating a power inverter having a bridge circuit comprising a first half-bridge comprising a high-side power device connected between a first node and a high-side node of an intermediate circuit storage, and a low-side power device connected between the first node and a low-side node of the intermediate circuit storage; and at least a second half-bridge comprising a high-side power device connected between a second node and the high-side node of the intermediate circuit storage, and a low-side power device connected between the second node and the low-side node of the intermediate circuit storage, the method comprising:
   detecting a collector-emitter voltage Vce and/or a collector current Ic;
   determining whether an overcurrent or overvoltage conditions has been met; and
   applying a gate voltage Vg above a surge threshold defining the onset of a surge current operation area of the respective power device.

9. The method according to claim 8, wherein it is determined whether an overcurrent or overvoltage conditions has been met in one or more of the high-side power devices and the low-side power devices of the first and second half-bridges if one of the following conditions holds true:
   a temporal change of the collector-emitter voltage dVce/dt is below a predetermined threshold (dVce/dt)crit; or
   a temporal change of the collector current dIc/dt is below a predetermined threshold (dIc/dt) crit.

10. The method according to claim 8, wherein the high-side power devices and the low-side power devices of the first and second half-bridges are each formed in an active area of a semiconductor body that comprises first switchable regions and second switchable regions different to the first switchable region, wherein the first switchable region comprises switchable cells that turn on at the first threshold voltage, and wherein the second switchable region comprises switchable cells that turn on at the second threshold voltage.

\* \* \* \* \*

UNITED STATES PATENT AND TRADEMARK OFFICE
CERTIFICATE OF CORRECTION

| | |
|---|---|
| PATENT NO. | : 11,394,194 B2 |
| APPLICATION NO. | : 16/791742 |
| DATED | : July 19, 2022 |
| INVENTOR(S) | : Laven et al. |

It is certified that error appears in the above-identified patent and that said Letters Patent is hereby corrected as shown below:

On the Title Page

Item (57)/Abstract, Lines 14-15, please change "becomes conducts" to -- becomes operable to conduct --

In the Claims

Column 24, Line 17, (Claim 6) please change "regions different" to -- region different --

Signed and Sealed this
Twentieth Day of September, 2022

*Katherine Kelly Vidal*

Katherine Kelly Vidal
*Director of the United States Patent and Trademark Office*